US009383662B2

(12) United States Patent
Vergeer et al.

(10) Patent No.: US 9,383,662 B2
(45) Date of Patent: Jul. 5, 2016

(54) LITHOGRAPHY SYSTEM FOR PROCESSING AT LEAST A PART OF A TARGET

(75) Inventors: Niels Vergeer, Rotterdam (NL); Guido de Boer, Leerdam (NL); Godefridus Cornelius Antonius Couweleers, Delft (NL); Laurens Plandsoen, Delft (NL); Cor Verburg, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 883 days.

(21) Appl. No.: 13/470,234

(22) Filed: May 11, 2012

(65) Prior Publication Data
US 2012/0287411 A1 Nov. 15, 2012

Related U.S. Application Data

(60) Provisional application No. 61/486,165, filed on May 13, 2011, provisional application No. 61/486,167, filed on May 13, 2011, provisional application No. 61/491,867, filed on May 31, 2011, provisional application No. 61/494,816, filed on Jun. 8, 2011, provisional application No. 61/510,886, filed on Jul. 22, 2011.

(51) Int. Cl.
*G03B 27/68* (2006.01)
*G03F 9/00* (2006.01)
(52) U.S. Cl.
CPC ............ *G03F 9/7088* (2013.01); *G03F 9/7096* (2013.01)
(58) Field of Classification Search
CPC .................... G03F 9/7088; G03F 9/7096
See application file for complete search history.

(56) References Cited

U.S. PATENT DOCUMENTS

| 3,935,497 A | 1/1976 | Cowles |
| 4,251,160 A | 2/1981 | Bouwhuis et al. |
| 4,631,416 A | 12/1986 | Trutna, Jr. |
| 4,701,606 A | 10/1987 | Tanimoto et al. |
| 4,716,441 A | 12/1987 | Ogawa |

(Continued)

FOREIGN PATENT DOCUMENTS

| CN | 1495540 | 5/2004 |
| CN | 1577080 | 2/2005 |

(Continued)

OTHER PUBLICATIONS

Durnin, J. "Exact Solutions for Nondiffracting Beams I. The Scalar Theory." J. Opt. Soc. Am. A. vol. 4, No. 4. Apr. 1987. pp. 651-654. 4 pages.

(Continued)

*Primary Examiner* — Deoram Persaud
(74) *Attorney, Agent, or Firm* — Blakely Sokoloff Taylor & Zafman LLP

(57) ABSTRACT

The invention relates to a lithography system for processing a target, wherein the lithography system comprises a final projection system arranged for projecting a pattern on the target surface. The lithography system comprises a mark position detection system arranged for detecting a position of a position mark on the target surface. The mark position detection system comprises an optical element arranged for projecting a light beam on the target surface and a light detector arranged for detecting a reflected light beam. The optical element may be positioned adjacent to the final projection system and the light detector may be positioned inside a frame.

31 Claims, 10 Drawing Sheets

(56) References Cited

U.S. PATENT DOCUMENTS

| | | |
|---|---|---|
| 4,861,162 A | 8/1989 | Ina |
| 4,967,088 A | 10/1990 | Stengl et al. |
| 5,243,195 A | 9/1993 | Nishi |
| 5,477,057 A | 12/1995 | Angeley et al. |
| 5,557,411 A | 9/1996 | Houryu et al. |
| 5,594,549 A | 1/1997 | Mori et al. |
| 5,644,137 A | 7/1997 | Waggener |
| 5,706,091 A * | 1/1998 | Shiraishi ............ G03F 7/701 355/53 |
| 5,721,605 A | 2/1998 | Mizutani |
| 5,745,242 A * | 4/1998 | Hata ............ G03F 9/70 250/559.3 |
| 5,783,833 A * | 7/1998 | Sugaya ............ G03F 9/70 250/548 |
| 5,827,629 A | 10/1998 | Miyatake |
| 5,861,944 A | 1/1999 | Nishi |
| 5,912,726 A | 6/1999 | Toguchi et al. |
| 5,929,454 A | 7/1999 | Muraki et al. |
| 5,943,135 A | 8/1999 | Mishima |
| 6,266,130 B1 | 7/2001 | Hasegawa |
| 6,429,943 B1 | 8/2002 | Opsal et al. |
| 6,459,473 B1 | 10/2002 | Chang et al. |
| 6,469,793 B1 | 10/2002 | Stanton |
| 6,522,411 B1 | 2/2003 | Moon et al. |
| 6,525,802 B1 | 2/2003 | Novak |
| 6,563,573 B1 | 5/2003 | Morohoshi |
| 6,583,430 B1 | 6/2003 | Muraki |
| 6,674,510 B1 | 1/2004 | Jasper et al. |
| 6,864,493 B2 | 3/2005 | Sato et al. |
| 7,116,626 B1 | 10/2006 | Woods et al. |
| 7,177,457 B2 | 2/2007 | Adel et al. |
| 7,474,410 B2 | 1/2009 | Moon |
| 2002/0020820 A1 | 2/2002 | Muraki |
| 2002/0043163 A1 | 4/2002 | Novak |
| 2003/0020184 A1 | 1/2003 | Ballarin |
| 2004/0059540 A1 * | 3/2004 | Matsumoto ......... G03F 7/70633 702/150 |
| 2004/0066518 A1 | 4/2004 | Kreuzer |
| 2004/0130690 A1 | 7/2004 | Koren et al. |
| 2004/0156026 A1 | 8/2004 | Kamiya |
| 2004/0165195 A1 * | 8/2004 | Sato ............ G03F 9/7096 356/614 |
| 2005/0002004 A1 | 1/2005 | Kolesnychenko et al. |
| 2005/0029981 A1 | 2/2005 | del Puerto |
| 2005/0031969 A1 | 2/2005 | Finders et al. |
| 2005/0069790 A1 | 3/2005 | Gruss et al. |
| 2006/0011869 A1 | 1/2006 | Tanaka |
| 2006/0058972 A1 | 3/2006 | Kok et al. |
| 2006/0103845 A1 * | 5/2006 | Tanaka ............ G03F 9/7011 356/401 |
| 2006/0138359 A1 | 6/2006 | Maeda |
| 2006/0139660 A1 * | 6/2006 | Kwan ............ G03F 7/70716 356/614 |
| 2006/0192931 A1 | 8/2006 | Roberts et al. |
| 2006/0279735 A1 | 12/2006 | Van Haren et al. |
| 2007/0041015 A1 | 2/2007 | Van Bilsen |
| 2007/0114678 A1 | 5/2007 | Van Haren et al. |
| 2007/0132996 A1 | 6/2007 | Van Haren et al. |
| 2007/0234786 A1 | 10/2007 | Moon |
| 2007/0247640 A1 | 10/2007 | Magome et al. |
| 2007/0260419 A1 * | 11/2007 | Hagiwara ............ 702/150 |
| 2008/0018897 A1 | 1/2008 | Littau |
| 2008/0074629 A1 * | 3/2008 | Groeneveld ......... G03F 7/70833 355/53 |
| 2008/0083881 A1 | 4/2008 | Gorrell et al. |
| 2008/0084547 A1 | 4/2008 | Tokuday |
| 2008/0123203 A1 * | 5/2008 | Onuki ............ G02B 7/003 359/824 |
| 2008/0151228 A1 * | 6/2008 | Hugers ............ G03F 9/7026 356/73 |
| 2008/0165368 A1 | 7/2008 | Matsumoto |
| 2008/0240501 A1 | 10/2008 | Van Der Wijst et al. |
| 2008/0266560 A1 * | 10/2008 | Kok ............ 356/399 |
| 2008/0291413 A1 * | 11/2008 | Steijaert ............ G03F 7/70775 355/53 |
| 2008/0316445 A1 * | 12/2008 | Watson ............ G03F 7/70258 355/53 |
| 2009/0002663 A1 * | 1/2009 | Freimann ............ G03F 7/706 355/67 |
| 2009/0061331 A1 * | 3/2009 | Nakano ............ G03F 7/70341 430/30 |
| 2009/0115983 A1 | 5/2009 | Stavenga et al. |
| 2009/0153861 A1 | 6/2009 | Musa et al. |
| 2009/0176167 A1 | 7/2009 | Hulsebos et al. |
| 2009/0195763 A1 * | 8/2009 | Butler ............ G03B 27/42 355/53 |
| 2009/0237637 A1 | 9/2009 | Warnaar et al. |
| 2009/0290139 A1 | 11/2009 | Van der Sijs |
| 2010/0091259 A1 * | 4/2010 | Koizumi ............ 355/67 |
| 2010/0245848 A1 * | 9/2010 | Sakamoto ............ G03F 9/7088 356/620 |
| 2011/0013171 A1 * | 1/2011 | Mueller ............ G03F 7/70258 355/74 |
| 2011/0090476 A1 | 4/2011 | Van de Kerkhof |
| 2011/0102753 A1 | 5/2011 | Van De Kerkhof et al. |
| 2012/0026479 A1 * | 2/2012 | Hembacher ......... G03F 7/70241 355/53 |
| 2012/0050709 A1 * | 3/2012 | Van Der Pasch ...... G03F 7/7085 355/67 |
| 2012/0242969 A1 * | 9/2012 | Van Der Pasch .... G03F 7/70775 355/72 |
| 2012/0268725 A1 * | 10/2012 | De Boer ............ G03F 9/7088 355/72 |
| 2014/0168625 A1 * | 6/2014 | Ito ............ G03F 7/70775 355/72 |
| 2015/0109598 A1 * | 4/2015 | Vergeer ............ G03F 9/7088 355/72 |

FOREIGN PATENT DOCUMENTS

| | | |
|---|---|---|
| CN | 101114135 | 1/2008 |
| CN | 101551593 | 10/2009 |
| EP | 0698826 A | 2/1996 |
| EP | 0999475 A2 | 5/2000 |
| EP | 1061561 | 12/2000 |
| EP | 1076264 A | 2/2001 |
| EP | 1091385 | 4/2001 |
| EP | 1111473 A | 6/2001 |
| EP | 1148390 | 10/2001 |
| EP | 1265271 | 12/2002 |
| EP | 1434103 | 6/2004 |
| EP | 1491966 | 12/2004 |
| EP | 1674937 | 6/2006 |
| EP | 1975981 | 10/2008 |
| JP | H0497513 | 3/1992 |
| JP | H06302498 | 10/1994 |
| JP | H07074082 | 3/1995 |
| JP | H07221166 | 8/1995 |
| JP | H0982626 | 3/1997 |
| JP | 2001358068 | 12/2001 |
| JP | 2002190438 | 7/2002 |
| JP | 2003037036 | 2/2003 |
| JP | 2005057222 A | 3/2005 |
| JP | 2006339647 | 12/2006 |
| JP | 2007142419 | 6/2007 |
| JP | 2008171960 | 7/2008 |
| JP | 2009277678 | 11/2009 |
| WO | 9839689 A | 9/1998 |
| WO | WO 03033199 | 4/2003 |
| WO | 2005010618 A | 2/2005 |
| WO | WO-2006009188 | 1/2006 |
| WO | 2007032670 A | 3/2007 |
| WO | 2007038134 A | 4/2007 |
| WO | WO-2007077925 | 7/2007 |
| WO | WO-2008037496 | 3/2008 |
| WO | WO-2008126925 | 10/2008 |
| WO | WO-2010032224 | 3/2010 |
| WO | WO-2010087352 | 8/2010 |

OTHER PUBLICATIONS

Reich, C et al. "3-D shape measurement of complex objects by combining photogrammetry and fringe projection", Optical Engineering, Jan. 2000, p. 224-231, vol. 39 No. 1.

(56) References Cited

OTHER PUBLICATIONS

Buydens, L et al. "Amplitude modulation and beam-steering properties of active binary phase gratings with reconfigurable absorption areas", Applied Optics, Jul. 20, 1994, p. 4792-4800, vol. 33, No. 21.
Lalanne, P et al. "Antireflection behavior of silicon subwavelength periodic structures for visible light", Nanotechnology, 1997, p. 53-56, vol. 8.
Robledo-Sanchez, C et al. "Binary grating with variable bar-space ratio following a geometrical progression", Optics Communications, 1995, p. 465-470, vol. 119.
Davis, J A et al. "Encoding amplitude and phase information onto a binary phase-only spatial light modulator", Applied Optics, Apr. 10, 2003, p. 2003-2008, vol. 42, No. 11.
Davis, J A et al. "Encoding amplitude information onto phase-only filters", Applied Optics, Aug. 10, 1999, p. 5004-5013, vol. 38, No. 23.
Takeda, M et al. "Fourier transform profilometry for the automatic measurement of 3-D object shapes", Applied Optics, Dec. 15, 1983, p. 3977-3982, vol. 22, No. 24.
Print of Internet publication "Improved Overlay for ASML Systems", downloaded on Sep. 1, 2007 from http://www.asml.com/asmldotcom/show.do?ctx=9976&rid=9991.
Collischon, M et al. "Optimized artificial index gratings", Infrared Physics & Technology, 1995, p. 915-921, vol. 36.
Leray, P et al. "Overlay Metrology for Double Patterning Processes", Proceedings of SPIE, vol. 7272 72720G-1, doi: 10.1117/12.814182.
Fuller, L. "Wafer alignment for Canon Stepper", downloaded from http://people.rit.edu/lffeee/align.pdf, 2008.
Tao, W et al. "Novel fast and accurate correlation-tracking algorithm", Oct. 8, 1996, translation by National Air Intelligence Center NAIC-ID(RS)T-0408-96.
Fuller, L., et al., "Introduction to ASML PAS 5500 Wafer Alignment and Exposure," Nov. 10, 2011, Rochester Institute of Technology Microelectronic Engineering, p. 1-47.
Hideki Ina et al. "Abberation evaluation of alignment optics in lithographic tools by use of a step-height structure highly sensitive to the asymmetry of an optical image", Applied Opics, vol. 46, No. 17, pp. 3485-3492, Jun. 10, 2007.
Final Office Action dated Oct. 13, 2015, U.S. Appl. No. 13/453,994. 15 pages.
Notice of Allowance in U.S. Appl. No. 13/453,986 mailed Nov. 24, 2015. 14 pages.
Final Office Action in U.S. Appl. No. 13/453,986 dated Jul. 16, 2015. 15 pages.
Notice of Allowance in U.S. Appl. No. 13/453,989 dated Jul. 30, 2015. 17 pages.
Japanese Office Action with English Language Translation, dated Mar. 1, 2016, Japanese Application No. 2014-506356.

* cited by examiner

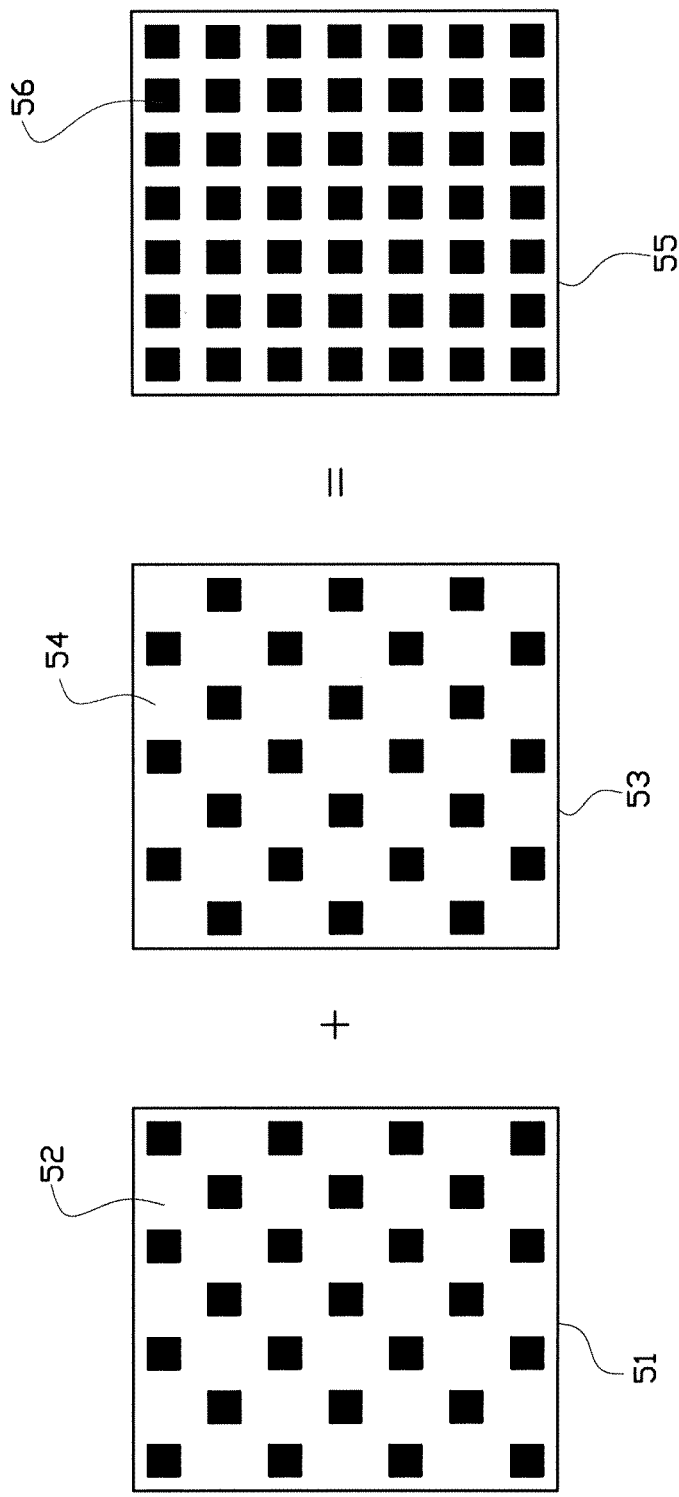

LITHOGRAPHY SYSTEM FOR PROCESSING AT LEAST A PART OF A TARGET

The present patent application is a non-provisional application claiming the benefit of US Provisional Application No. 61/486,165, filed May 13, 2011; US Provisional Application No. 61/486,167, filed May 13, 2011; US Provisional Application No. 61/491,867, filed May 31, 2011; US Provisional Application No. 61/494,816, filed Jun. 8, 2011; and US Provisional Application No. 61/510,886, filed Jul. 22, 2011, which are incorporated by reference in their entirety.

The invention relates to a lithography system for processing at least a part of a target, the target comprising for example a wafer.

Systems for processing a target are known in the art, usually comprising a final projection system for projecting a patterning beam on the target surface and a system for determining the position (and/or orientation) of a wafer with respect to the final projection system. In general, these systems may use position marks on the wafer and position marks on a chuck, which is a part of the lithography system and is supporting the wafer. Before a session of projecting a pattern, the position (and/or orientation) of a wafer with respect to the final projection system may be determined.

However, it may be difficult to determine the position of the wafer with a high accuracy.

Furthermore, systems for determining the position of a wafer may have a large volume and thus may occupy a large amount of space. This amount of space may not be available near the final projection system in the lithography system because of the presence of other subsystems or modules of the lithography system. Moreover, such large amount of space may require additional resources when it is placed in a vacuum chamber or a so-called clean room, for example a larger vacuum chamber, a larger clean room and/or vacuum pumps with a higher capacity. Therefore, the space occupied by the system for determining the position of a wafer may cause limitations in the spatial design of the lithography system.

It is an object of the present invention to provide an improved lithography system.

SUMMARY OF THE INVENTION

The object of the present invention is met by providing a lithography system for processing at least a part of a target, the target comprising a target surface with a position mark, the lithography system comprising
- a beam source arranged for providing a patterning beam,
- a final projection system arranged for projecting said pattern on at least a part of the target surface;
- a mark position detection system arranged for detecting a position of the position mark on the target surface, the mark position detection system comprising a light source arranged for providing a light beam, an optical element arranged for projecting said light beam on the target surface and a light detector arranged for detecting a reflected light beam, wherein the reflected light beam is generated by reflection of the light beam on the target surface.

The light detector of the mark position detection system (for example a CCD camera) usually has a large volume in comparison with the other elements of the mark position detection system. An advantage of the optical system is that it enables the light detector to be placed at a certain distance from the optical element arranged for projecting the light beam on the target surface and, preferably, from the final projection system.

Therefore the light detector may be placed where space is available and/or where the additional resources may be limited.

In an embodiment of the system according to the invention, said the final projection system has a projection axis, the light detector is positioned at a distance from the projection axis and said optical element is positioned between the final projection system and the light detector.

In an embodiment of the system according to the invention, the system further comprises a support system, comprising a final projection system support arranged for supporting the final projection system.

In an embodiment of the system according to the invention, the support system further comprises a frame arranged for supporting the final projection system support.

In an embodiment of the system according to the invention, the final projection system support comprises a support ring, arranged for supporting the final projection system.

In an embodiment of the system according to the invention, the final projection system support comprises a holder for holding the support ring and the support ring is arranged between the holder and the final projection system and wherein the frame is arranged for supporting the holder.

In an embodiment of the system according to the invention, the final projection system support, or in particular the support ring, comprises a material with a low thermal expansion coefficient in comparison with material of the final projection system and/or the holder.

In an embodiment of the system according to the invention, said optical element is positioned in or on the final projection system support.

In an embodiment of the system according to the invention, said optical element is positioned in or on the support ring.

An advantage of this embodiment may be that in this embodiment, temperature variations may influence the distance between the final projection system and said optical element to a lesser extend, since some of the material between the final projection system and said optical element has a low thermal expansion coefficient.

In an embodiment of the system according to the invention, the support ring is connected to the holder by flexures.

In an embodiment of the system according to the invention, the final projection system is connected by flexures to the final projection system support, or in particular to the support ring.

An advantage of these embodiments may be that the final projection system, the final projection system support and/or the holder may expand (for example due to temperature variations), while the projection axis will remain more or less at its position.

In an embodiment of the system according to the invention, the final projection system comprises:
- projection lens element for projecting said patterning beam on at least a part of the target surface; and,
- scan deflection element for scanning said patterning beam over at least a part of the target surface.

In a further embodiment of the system according to the invention, the projection lens element is connected by flexures to the final projection system support, or in particular to the support ring.

Since the projection lens element is the final element in the optical column to change the optical path or direction of the patterning beam, it is important that the distance between the optical axis of this element and the optical element remains as constant as possible. Therefore, it is advantageous to connect them via flexures, that may allow some expansion of the final projection system.

In an embodiment of the system according to the invention, the optical element is arranged for projecting said light beam substantially perpendicularly on the target surface and/or wherein a final projection system has a projection axis and the projection axis is arranged substantially perpendicular to said part of the target surface.

In an embodiment of the system according to the invention, the light detector is positioned in the frame.

The light detector of the mark position detection may be generating heat when in use, especially when the light detector is a CCD camera or such. The heat generated by the light detector may contribute to the problem of thermal expansion as is described above.

Therefore, it may be advantageous that, according to an embodiment of the invention, the light detector is positioned inside the frame. In that case, heat generated by the light detector will not or to a lesser extend contribute to the problem of thermal expansion, while the distance between said optical element and the final projection system may be limited or small and thus the variation of the distance may also be limited or small. The heat generated by the light detector may be transported via the frame to a cooling device, which may be positioned outside of the lithography system.

In an embodiment of the system according to the invention, said optical element is positioned next to or adjacent to the final projection system.

The position of target surface may be determined by detecting a position of a position mark on the target surface with respect to an optical element of the mark position detection system, wherein said optical element is arranged for projecting the light beam on the target surface. The determined position of the target may be used to determine the position of the patterning beam when it is, in use, patterning the surface of the target, but only when the distance between said optical element and the final projection system is known. It may be required that this distance remains constant between patterning sessions, wherein a patterning session may start with determining the position of the target surface. Indeed, a varying distance may cause for example patterning errors on the surface.

Due to thermal expansion of (a part of) the material of the lithography system, variation may be introduced in the distance between said optical element and the final projection system. It may be understood that these variations will depend among others on the amount or length of the material between said optical element and the final projection system, as more material will expand more (in nanometer) when the temperature increases.

Therefore, it may be advantageous to position said optical element next to or adjacent to the final projection system, thus lowering the amount of material between said optical element and the final projection system.

In an embodiment of the system according to the invention, the optical element is positioned in the frame.

In an embodiment of the system according to the invention, the frame is arranged for supporting one or more modules, wherein said one or more modules comprise at least one of:
an illumination optics module, preferably comprising the beam source;
an aperture array and condenser lens module;
a beam switching module; and,
a projection optics module, preferably comprising the final projection system.

In an embodiment of the system according to the invention the lithography system further comprises said one or more modules.

Furthermore, a lithography system may comprise an actuator system arranged for moving the target with respect to the final projection system during the processing of at least a part of the target. The actuator may be arranged for moving the target in a two-dimensional range R1, such that the final projection system is able to project the patterning beam on the whole part of the target that is to be processed.

The actuator may further be arranged for moving the target a two-dimensional range R2 such that said optical element is able to focus the light beam on the whole part of the target that comprises (or may comprise) position marks.

The actuator may thus be arranged for moving the target in a combined area of area R1 and area R2. It may be advantageous that the combined area is as small as possible, since moving the target may require space inside the lithography system. The combined area is smaller, when an overlap between R1 and R2 is larger. This may be achieved when said optical element is positioned next to or adjacent to the final projection system.

The target may comprise a wafer and thus the target surface may comprise a wafer surface. The target may also comprise a chuck, arranged for support the wafer. The target surface may comprise the wafer surface and a surface of the chuck. The lithography system may then be arranged for processing the wafer surface.

Said optical element may be a focus lens, a mirror or an optical fiber, each arranged for focusing the light beam on the target surface. The patterning beam may be a patterning light beam or a patterning charged particle beam, such as an electron beam. The patterning beam may comprise at least two beamlets.

In an embodiment of the system according to the invention, said optical element comprises a centre point and a distance D1 is defined between the projection axis of the final projection system and said centre point; and, said distance D1 is smaller than 60 mm, preferably smaller than 50 mm, or about 45 mm.

The projection axis of the final projection system may be defined as a centre longitudinal axis of the final projection system or as a centre longitudinal axis of the patterning beam, where the patterning beam is emitted by the final projection system.

An advantage of this embodiment is that a small distance between said optical element and the final projection system may result in a decrease in variations of said distance and thus in a decrease in the patterning error of the lithography system.

In an embodiment of the system according to the invention, said optical element comprises a centre point and a distance D1 is defined between the projection axis of the final projection system and said centre point;
said optical element is positioned in a plane perpendicular to the projection axis;
a cross section of the final projection system in said plane has a diameter D-fps; and,
the distance D1 is smaller than said diameter D-fps, or preferably smaller than 0.7×D-fps.

An advantage of this embodiment may be that said optical element is positioned close to the final projection system relative to the diameter of the projection system.

In another embodiment, a distance D4 between the final projection system and the optical element may be smaller than said diameter D-fps, or maybe smaller than 0.7×D-fps.

In an embodiment of the system according to the invention,
said optical element comprises a centre point and a distance D1 is defined between the projection axis of the final projection system and said centre point;
the light detector comprises a light detecting surface, the light detecting surface having a centre point;
a distance D2 is defined between the centre point of the light detecting surface and the projection axis of the final projection system; and,
D1 is smaller than D2, preferably smaller than $0.3 \times D2$.

An advantage of this embodiment may be that the light detector (or light detecting surface) is positioned much further away from the final projection system than the optical element, thus the heat that may be generated by the light detector (or light detecting surface) may not (or to a lesser extent) influence the temperature of material positioned between the final projection system and the optical element, which may be a focus lens.

In an embodiment of the system according to the invention, the light detector comprises a camera, preferably a CCD camera. An advantage of a camera may be that it enables the detection of the position and/or orientation of a structure of the position mark, without moving the target surface.

The final projection system may provide a construction in which said optical element and further optical elements of the mark position detection system may be arranged, for example a focus lens, mirrors and/or other lenses.

In an embodiment of the system according to the invention,
the mark position detection system comprises a reference plate, the reference plate comprising a reference mark and being at least partly transparent for the reflected light beam; and,
the reference plate is positioned in a light path of the reflected light beam, preferably between said optical element and the target surface.

A position mark may comprise a structure. The position and the orientation of the structure may therefore be indicative of the position and orientation of the target surface. It may be advantageous that the light detector is arranged for detecting said structure. However, an image of the structure (i.e. of the position mark) that is detected at the light detector, may be influenced by aberrations or other errors occurring in the light path of the reflected light beam.

The reference plate may comprise a structure and the structure of the reference plate may also be detected by the light detector, preferably at the same time the structure of the position mark is detected. The position and the orientation of the position mark may then be detected or determined with respect to the reference plate. This may enable a detection of the position and orientation of the position mark with a higher accuracy.

An image of the structure of the reference plate that is detected at the light detector, may be influenced by aberrations or other errors occurring in the light path of the reflected light beam in substantially the same way as the image of the structure of the position mark. Since the position and orientation of the position mark may be determined with respect to the reference plate, these aberrations (or other errors) may cancel each other out, at least partly.

In an embodiment of the system according to the invention, the reference plate is arranged on the support ring.

Since the position of the position mark may be detected or determined with respect to the reference plate, it may be advantageous to keep the distance between the reference plate and the final projection system as constant as possible, in a similar way it is advantageous to keep the distance between said optical element and the final projection system as constant as possible, as described above.

Since the reference plate is provided on the support ring and the support ring comprises material with a low thermal expansion coefficient and is connected with the final projection system, said distance may be kept more constant in spite of temperature variations.

In an embodiment of the system according to the invention, the mark position detection system comprises an optical system arranged for guiding the light beam towards the target surface and for guiding the reflected light beam toward the light detector, the optical system comprising said optical element.

In an embodiment of the system according to the invention, the optical system comprises a first lens arranged for collimating the reflected light beam and a second lens arranged for focusing a collimated reflected light beam, wherein the collimated reflected light beam is generated by the first lens.

An advantage of this embodiment may be that this embodiment may provide a telescopic optical system, i.e. the distance between the first and the second lens may be changed without the need for adjusting the other optical elements of the optical system (or the position of the object and/or the position of the light detecting surface). In that case, the distance between the final projection system support, that may contain said optical element and the first lens, and the frame, that may contain the light detector and the second lens, may vary (for example as a result of temperature changes), while these distance variations do not influence the focusing (or projecting) of the reflected light beam on the light detector.

In an embodiment of the system according to the invention, the first lens is arranged inside the final projection system support and said optical element is arranged inside the frame.

An advantage of this embodiment may that the distance between the final projection system support and the frame may vary, due to for example temperature variations. Because of the telescopic construction, this will not or to a lesser extend influence the projection of the reflected light beam on the light detector.

In an embodiment of the system according to the invention, the optical system comprises at least one telecentric lens in an optical path of the reflected light beam. An advantage of a telecentric lens may be that it provides images with constant magnification and geometry, regardless of the distance of the object to the lens (or the distance of the image to the lens). In this way, the size and/or orientation of a structure detected in the light detector may not or to a lesser extend depend on these distances. And as explained above, these distances may vary for example because of temperature variations.

In an embodiment of the system according to the invention, the optical system comprises an aperture positioned in an optical path of the reflected light beam after the at least one telecentric lens. If an object plane (i.e. the plane the object is positioned in) or an image plane (i.e. the plane the light detecting surface is positioned in) of a telecentric lens is out of focus, the image may become blurred. An advantage of an aperture may be that it may limit the blurring of the image, especially when it is positioned in a focal plane of the telecentric lens.

In an embodiment of the system according to the invention, the optical system further comprises an optical fiber arranged for guiding the light beam. Since the generation of the light beam in a light source may generate heat, it may be advantageous to position the light source at a distance from the final projection system and the final projection system support. It may even be advantageous to position the light source outside the vacuum chamber of the lithography system.

In an embodiment of the system according to the invention,
the mark position detection system is further arranged for detecting another position of another position mark on the target surface;
the light source is further arranged for providing another light beam;
the mark position detection system further comprises another optical element arranged for projecting the other light beam substantially perpendicularly on the target surface; and,
the light detector is arranged for detecting another reflected light beam, wherein the other reflected light beam is generated by reflection of the other light beam on the target surface.

It may be advantageous to detect the position of two (or more) position marks on the target surface in order to determine the position and orientation of the target surface. It may be advantageous to position the two position marks at a certain distance from each other. In that case, it may be advantageous to provide another optical element, for example a focus lens, also at a certain distance from the (first) optical element, for example also a focus lens, in order to detect the position of the two position marks without a large movement of the target surface.

Furthermore, the optical system may be arranged to use the same light source for providing two light beams and the same light detector for the detection of the two position marks. The optical system may be provided with (optical) switches (such as mirrors), in order to first guide the light beam to the first position mark and the reflected light beam to the light detector and then to guide the light beam to the second position mark and the reflected light beam to the light detector.

In an embodiment of the system according to the invention, the optical system further comprises another optical fiber arranged for guiding the other light beam.

In an embodiment of the system according to the invention, the lithography system further comprises
an actuator arranged for moving the target surface in at least two dimensions;
another mark position detection system arranged for detecting a position of a position mark on the target surface, the other mark position detection system comprising a light source arranged for providing a light beam, an optical element arranged for projecting said light beam substantially perpendicularly on the target surface and a light detector arranged for detecting a reflected light beam, wherein the reflected light beam is generated by reflection of the light beam on the target surface;
wherein the optical element of the mark position detection system is arranged for guiding the light beam of the mark position detection system on spots of an area A of the target surface during the movement of the target surface;
wherein the optical element of the other mark position detection system is arranged for guiding the light beam of the other mark position detection system on spots of an area B of the target surface during the movement of the target surface; wherein an overlap of area A and area B is less than 10%, in a range of 5%-10%, less than 5%, or 0%.

It may be advantageous to detect the position of two (or more) position marks on the target surface in order to determine the position and orientation of the target surface. It may the case that the two position marks are positioned at opposite sides of the target surface, such that a distance between the position marks is in the range of 0.8-0.99 of a length of the target surface (wherein the length of the target may be determined in a line intersecting with both position marks). In that case, a lithography system with a single mark position detection system would require an actuator arranged for moving the target surface at least a distance of 0.8-0.99 of the length of the target surface. It would also require space inside the vacuum chamber of the lithography system for this movement.

In the case of another mark position detection system, the first mark position detection system may be arranged for detecting the position of position marks that are arranged on an area A of the target surface, while the second mark position detection system may be arranged for detecting the position of position marks that are arranged on an area B of the target surface. For example, when area A and B each comprise a separate half of the target surface, the actuator may be arranged for moving the target surface at maximum over a distance of 0.5-0.6 of the length of the target surface, depending of the overlap of areas A and B. This would also require less space inside the vacuum chamber of the lithography system for the movement of the target surface.

Some overlap may be advantageous as it implies that position marks that are arranged in the overlap area may be detected by both mark position detection systems. In that way, these position marks may be detected with a higher accuracy. Furthermore, the working of one mark position detection system may be compared to the working of the other mark position detection system, with respect to these position marks.

In an embodiment of the system according to the invention, the lithography system further comprises a wafer with a disk-shaped wafer surface, wherein:
the target surface comprises the wafer surface;
the optical element comprises a centre point and a distance D1 is defined between the projection axis of the final projection system and said centre point;
the distance D1 is smaller than 0.5×a diameter of the wafer surface.

It may be the case that position marks are arranged close to an area of the wafer surface, the area which is to be patterned with the patterning beam. The position of the position marks may need to be detected before the process of patterning said area will start. Since the distance D1 is smaller than 0.5×the diameter of the wafer surface, the movement of the wafer surface after the detection of the position of the position marks will be small. A small movement may take a short time and thus the speed of processing wafer may be advantageously decreased, when the distance D1 is small.

In an embodiment of the system according to the invention, the lithography system further comprises a wafer with a disk-shaped wafer surface, wherein:
the target surface comprises the wafer surface;
the optical element comprises a centre point and a distance D1 is defined between the projection axis of the final projection system and said centre point;
the distance D1 is larger than 0.5×a diameter of the wafer surface.

It may be the case that position marks are provided outside of the wafer surface. In general, the lithography system may be provided with a chuck that is arranged for supporting the wafer. The chuck may comprise a chuck surface which may be provided with position marks. The target surface may comprise the chuck surface, or, the target surface may consist of the chuck surface and the wafer surface.

It may be the case that the position marks on the chuck surface are arranged far from the area of the wafer surface, the area which is to be patterned with the patterning beam. The position of these position marks may need to be detected before the process of patterning said area will start. Since the distance D1 is larger than 0.5×a diameter of the wafer surface, the movement of the wafer surface after the detection of the position of the position marks may advantageously be small.

In an embodiment of the system according to the invention, the lithography further comprises
- a wafer with a disk-shaped wafer surface, wherein the target surface comprises the wafer surface;
- another mark position detection system arranged for detecting a position of a position mark on the target surface, the other mark position detection system comprising a light source arranged for providing a light beam, an optical element arranged for projecting said light beam substantially perpendicularly on the target surface and a light detector arranged for detecting a reflected light beam, wherein the reflected light beam is generated by reflection of the light beam on the target surface;

wherein a distance D3 between a centre point of the optical element of the mark position detection system and a centre point of the optical element of the other mark position detection system is larger than a diameter of the wafer surface.

It may be advantageous to detect the position of two (or more) position marks on the target surface in order to determine the position and orientation of the target surface. It may the case that the two position marks are positioned at opposite sides of a chuck surface, such that a distance between the position marks is larger than a diameter of the wafer surface.

Therefore, when the distance between the centre of the optical element of the mark position detection system and the centre of the optical element of the other mark position detection system is larger than a diameter of the wafer surface, a movement of the target surface (i.e. the chuck surface) between detecting the position of first position mark on the chuck surface and detecting the position of the second position mark on the chuck surface may advantageously be small.

In an embodiment, the lithography system further comprises a wafer with wafer surface and a chuck with a chuck surface, wherein the chuck is arranged for supporting the wafer; wherein the target surface comprises the wafer surface and the chuck surface; wherein said optical element is arranged above the chuck surface or above the wafer surface.

The term "above" may be defined with respect the target surface. In this case, the final projection system may also be arranged above the target surface.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 5 schematically shows examples of: an image of a reference mark, an image of a position mark and a resulting image according to an embodiment of the invention;

DETAILED DESCRIPTION OF THE INVENTION

Figure 1:
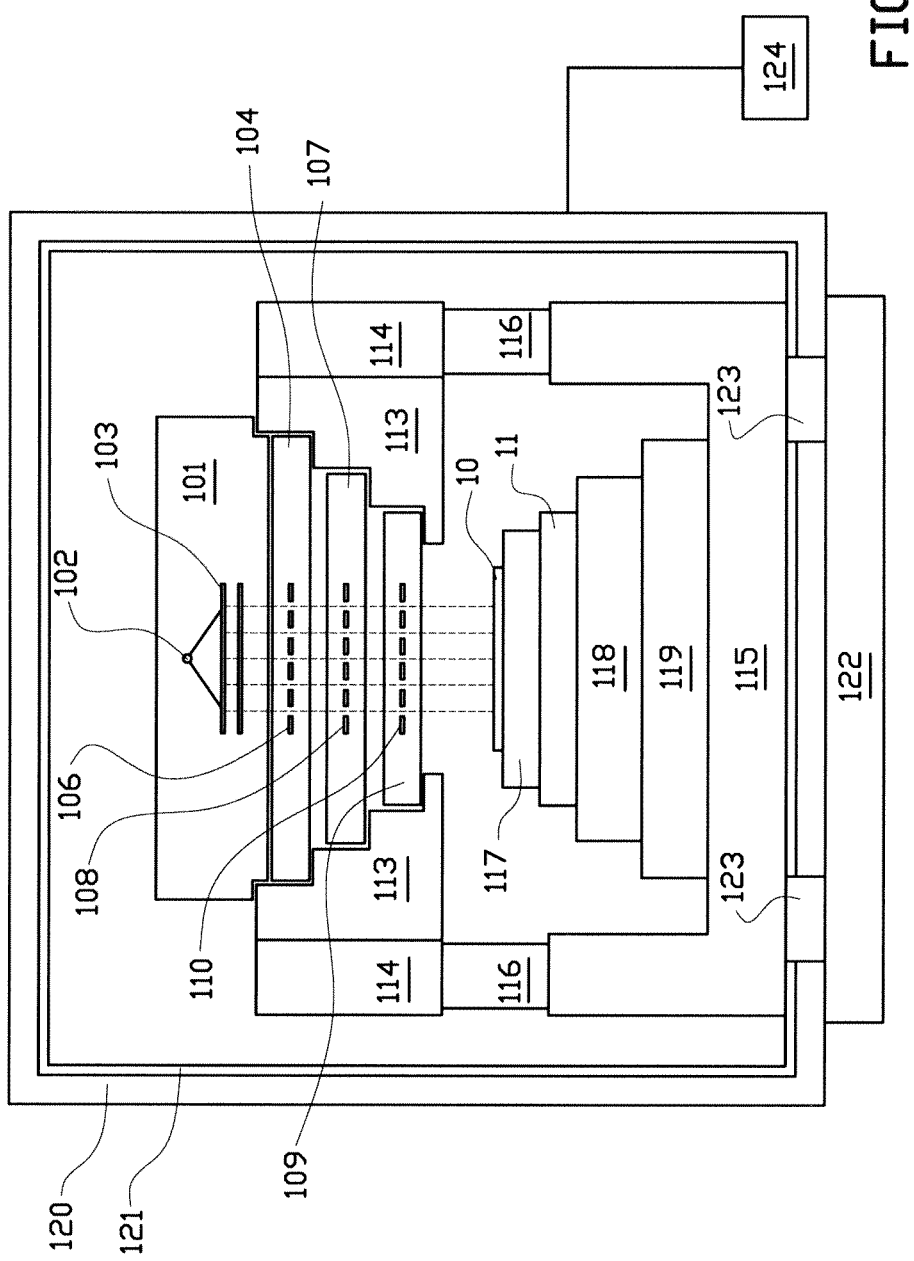
FIG. 1 shows a schematic overview of a part of a lithography system according to an embodiment of the invention.

FIG. 1 shows a schematic overview of a part of a lithography system according to an embodiment of the invention.

The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 1, these modular subsystems or modules may include:
- an illumination optics module 101, which may comprise a beam source 102 and a beam collimating system 103,
- an aperture array and condenser lens module 104, which may include an aperture array and condenser lens array, together indicated by 106,
- a beam switching module 107, which may include beamlet blanker array 108; and,
- a projection optics module 109, which may include a beam stop array, beam deflector array and projection lens array, together indicated by 110. The projection optics module may comprise the final projection system as described above. The final projection system may comprise the projection lens array, which is also referred to as the projection lens element.

The modules may be designed to slide in and out from a frame. In the embodiment shown in FIG. 1, the frame may comprise an alignment inner subframe 113 and an alignment outer subframe 114.

A main frame 115 may support the alignment subframes 113 and 114 via vibration damping mounts 116. A wafer table 117 may support wafer 10, while the wafer table is mounted on chuck 11. Chuck 11 may be positioned on a stage short stroke 118 and long stroke 119. To the stage short stroke 118 and long stroke 119 together may be referred to as an actuator in this document.

The lithography machine may be enclosed in vacuum chamber 120, which may include a metal shielding layer or layers 121. The system may rests on base plate 122 and may be supported by frame members 123. A support system may comprise the alignment subframes 113 and 114, the final projection system support, the vibration damping mounts 116 and/or the base plate 122.

Each modular subsystem may require a large number of electrical signals and/or optical signals, and electrical power for its operation. The modular subsystems or modules inside the vacuum chamber 120 may receive these signals from a processor unit 124 which is preferably located outside of the chamber.

The patterning beam from the beam source 102 may be collimated by collimator lens system 103. The collimated beam may impinge on an aperture array, which may block a part of the collimated beam, in order to create a plurality of beamlets, for example at least two beamlets. However, a lithography system according to an embodiment of the invention may be arranged for generating a large number of beamlets, preferably about 10,000 to 1,000,000 beamlets.

The beamlets may pass through a condenser lens array 106, which may focus the beamlets in the plane of a beam blanker array, comprising a plurality of blankers for deflecting one or more of the beamlets.

The deflected and undeflected beamlets may arrive at beam stop array, which may have a plurality of apertures. The beamlet blanker array and beam stop array may operate together to block or let pass the beamlets. If the beamlet blanker array deflects a beamlet, it will not pass through the corresponding aperture in the beam stop array, but instead it will be blocked. But, when the beamlet blanker array does not deflect a beamlet, it will pass through the corresponding aperture in the beam stop array, and through the beam deflector array and the projection lens arrays.

The beam deflector array may provide for deflection of each beamlet in the x- and/or y-direction (for example in a plane parallel with the target surface), substantially perpendicular to the z-direction (or parallel with the projection axis of the final projection system) of the undeflected beamlets, to scan the beamlets across the surface of the target.

The beamlets may pass through projection lens arrays and may be projected onto the wafer 10. The projection lens array preferably provides a demagnification in the order of 25 to 500 times (depending of the specific electron-optical lay out). The beamlets may impinge on the surface of wafer positioned on moveable chuck 11, which may be arranged for carrying the target. For lithography applications, wafer is usually provided with a charged-particle sensitive layer or resist layer.

The lithography system may operate at least partly in a vacuum environment. A vacuum may be desired to remove particles which may be ionized by the patterning beams and become attracted to the beam source and may dissociate and be deposited onto the machine components and may disperse the patterning beams or beamlets.

In order to maintain the vacuum environment, the lithography system may comprise a vacuum chamber 120. All of the major elements of the lithography system are preferably housed in the vacuum chamber, such as beam source, the optical column and the moveable chuck.

Figure 2:
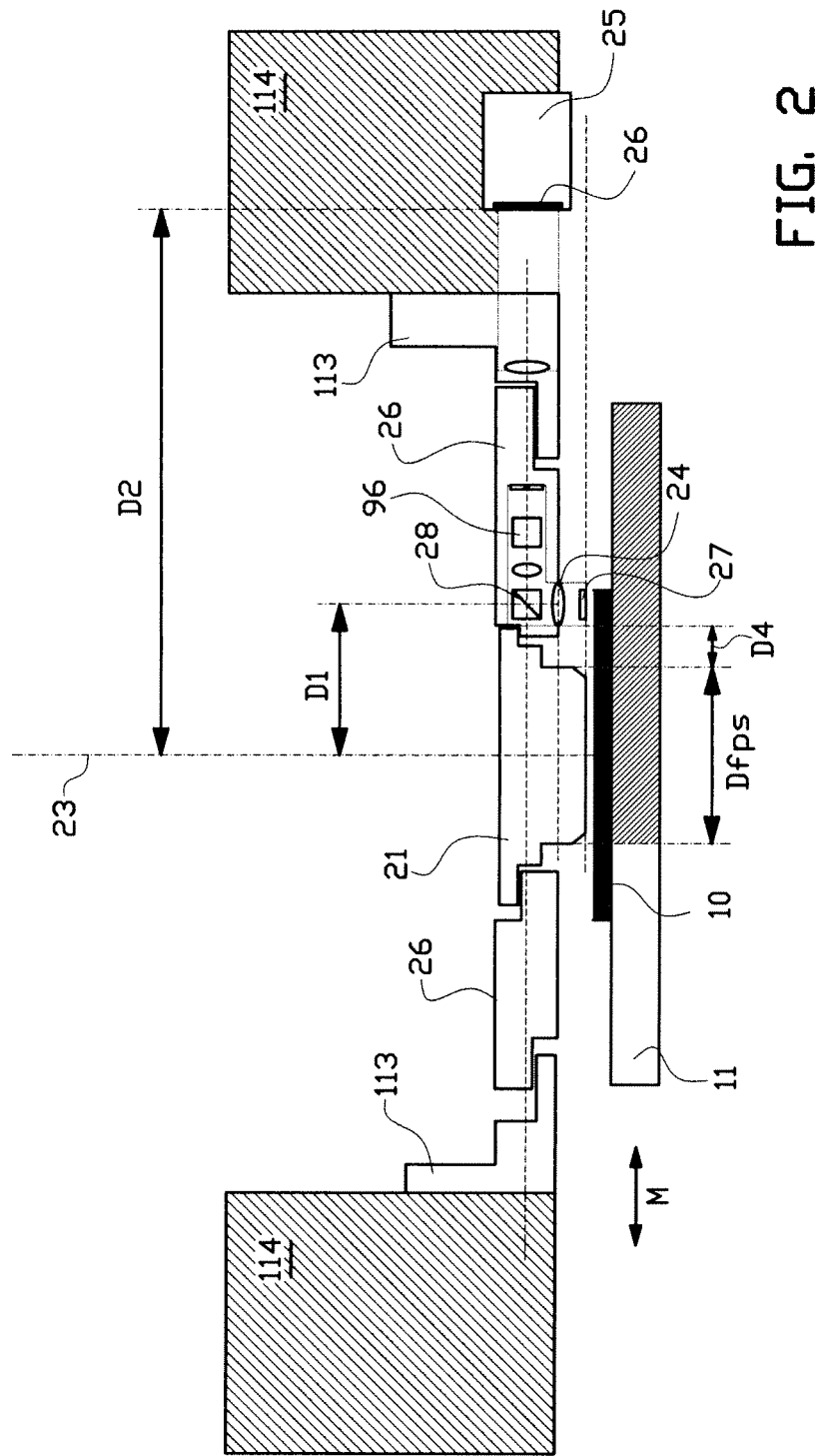
FIG. 2 shows a schematic cross-section of a part of a lithography system according to an embodiment of the invention.

FIG. 2 shows a schematic cross-section of a part of a lithography system according to an embodiment of the invention.

The lithography system may comprise a beam source 102 (not shown in FIG. 2) arranged for providing a patterning beam. The patterning beam may be a patterning light beam or a patterning charged particle beam, such as an electron beam. The patterning beam may comprise at least two beamlets, generated as is described above.

The lithography system may comprise a final projection system 21 arranged for projecting the patterning beam on at least a part of the target surface 22. The target surface may comprise a surface of a wafer 10 and a surface of the chuck 11. Position marks may be provided on the surface of the wafer 10 and/or on the surface of the chuck 11.

The lithography system may comprise an actuator arranged for moving the target surface. A direction of movement is indicated by arrow M in FIGS. 2 and 3.

The final projection system may be the final part of the optical column comprising electro-optical elements, arranged for projecting the patterning beam on the surface 22. The final projection system may have a substantially tubular shape. It may comprise a projection lens array. The final projection system may have a projection axis which may be parallel to the patterning beam, being emitted from the final projection system and it may be located in the centre of the patterning beam being emitted from the final projection system. The projection axis may therefore be defined by the electro-optical elements of the final projection system.

The lithography system may further comprise a mark position detection system arranged for detecting a position of a position mark on the target surface, for example a position mark on the surface of the wafer or a position mark on the surface of the chuck.

The mark position detection system may comprise a light source (not shown in FIG. 2) arranged for providing a light beam. The light source may be a laser, a LED or any other light generating device. The mark position detection system may further comprise an optical element arranged for projecting the light beam substantially perpendicularly (or parallel with the projection axis) on the target surface.

The light source may be provided at a certain distance and a mirror 96 may be used to couple the light beam, transported from the light source via, for example, a fiber, in the light path between the optical element 24 and the light detector. The mirror 96 may be provided in accordance to the mirror 83, 84 in FIG. 8.

In general The mark position detection system may project the light beam on the same side of the target as the final projection system projects the patterning beam.

In the FIG. 2, said optical element is a focus lens 24 arranged for focusing the light beam on the target surface, or on a position mark on the target surface. Said optical element may also be mirror 28, if the focus lens 24 is omitted. Said optical element may be the optical element from which the light beam leaves the mark position detection system towards the target surface, and/or it may be the optical element through which the reflected light beam enters the mark position detection system towards the light detector. The optical element from which the light beam leaves the mark position detection system towards the target surface may be the same optical element as the optical element through which the reflected light beam enters the mark position detection system towards the light detector.

In some embodiments described below, the optical element arranged for projecting the light beam on the target surface is a focus lens, in other embodiments the optical element arranged for projecting the light beam on the target surface may be a mirror. However, what is applicable to the focus lens may also be applicable to another optical element arranged for projecting the light beam substantially perpendicularly on the target surface, or more in particular, it may also be applicable to the mirror, and vice versa.

The light beam leaving the mark position detection system from the focus lens 24 may be substantially parallel to the projection axis of the final projection system.

The light beam may be reflected by the target surface and in this way a reflected light beam is generated. The mark position detection system may comprise a light detector which is arranged for detecting said reflected light beam. The reflected light beam may carry information about the target surface, more in particular about a position mark on which the light beam may have been reflected. The light detector 25 may be (or comprise) a camera, preferably a CCD camera.

A position mark may comprise areas with different reflection coefficients with regard to the light of the light beam. Another option may be that the position mark as a whole has a different reflection coefficient (with regard to the light of the light beam) than the target surface without a position mark. A position of the position mark may be detected by moving the target surface (and thus the position mark) and detecting an intensity of the reflected light beam as a function of the position of the position mark.

The lithography system may further comprise a support system. The support system may comprise a final projection system support 26 and a frame, wherein the final projection system support 26 is arranged for supporting the final projection system 21 and the frame is arranged for supporting the final projection system support 26. The frame may comprise the alignment inner subframe 113 and the alignment outer subframe 114, wherein the alignment inner subframe 113 is arranged for supporting the final projection system support 26.

The mark position detection system may comprise an optical system that comprises the optical element (for example focus lens 24). The optical system may be arranged for guiding the reflected light beam toward the light detector and may be arranged for guiding the light beam towards the target surface.

As can be seen from FIG. 2, said optical element, the focus lens 24, may be positioned adjacent to the final projection system in a plane perpendicular to the projection axis. The light detector may be positioned inside the frame or in the alignment inner subframe 114. Said optical element, the focus lens 24, may be arranged in the final projection system support 26.

The heat that the light detector 25 may generate may be transferred via the frame, for example the alignment inner subframe 114, to a cooling device. Because the light detector is arranged inside the frame, the generated heat may not or to a lesser extend cause temperature variations near the final projection system 21 and/or said optical element, the focus lens 24.

A distance D1 is indicated in FIG. 2 between the projection axis 23 and a centre point of the focus lens 24. The surface of the wafer may be disk-shaped with a diameter in a range of 25-500 mm or in a range of 200-400 mm, or preferably about 300 mm. The distance D1 may be smaller than 0.3×the diameter of the wafer surface. In an embodiment of the invention, the distance D1 may be smaller than 60 mm, preferably smaller than 50 mm, or about 45 mm.

A centre point of the optical element may be positioned on the optical axis of the optical element.

In FIG. 2, a diameter D-fps of a cross section of the final projection system 21 is shown, wherein said cross section is defined in a plane, which is perpendicular to the projection axis and in which said optical element, the focus lens 24, is positioned. The distance D1 may be smaller than said diameter D-fps, or preferably smaller than 0.7×D-fps.

In FIG. 2, a distance D4 is shown, between the final projection system and the optical element. The distance D4 may be smaller than a diameter of the final projection system, for example, smaller than 0.7×said diameter of the final projection system.

In an embodiment of the invention, the light detector comprises a light detecting surface having a centre point. In FIG. 2, a distance between the centre point of the light detecting surface and the projection axis of the final projection system has been indicated by D2. D1 may be smaller than D2, preferably smaller than 0.3×D2.

This may imply that the light detector (or light detecting surface) is positioned further away from the final projection system than said optical element, the focus lens. Heat that may be generated by the light detector (or light detecting surface) may not (or to a lesser extent) influence the temperature of material positioned between the final projection system and said optical element, the focus lens.

Figure 3:
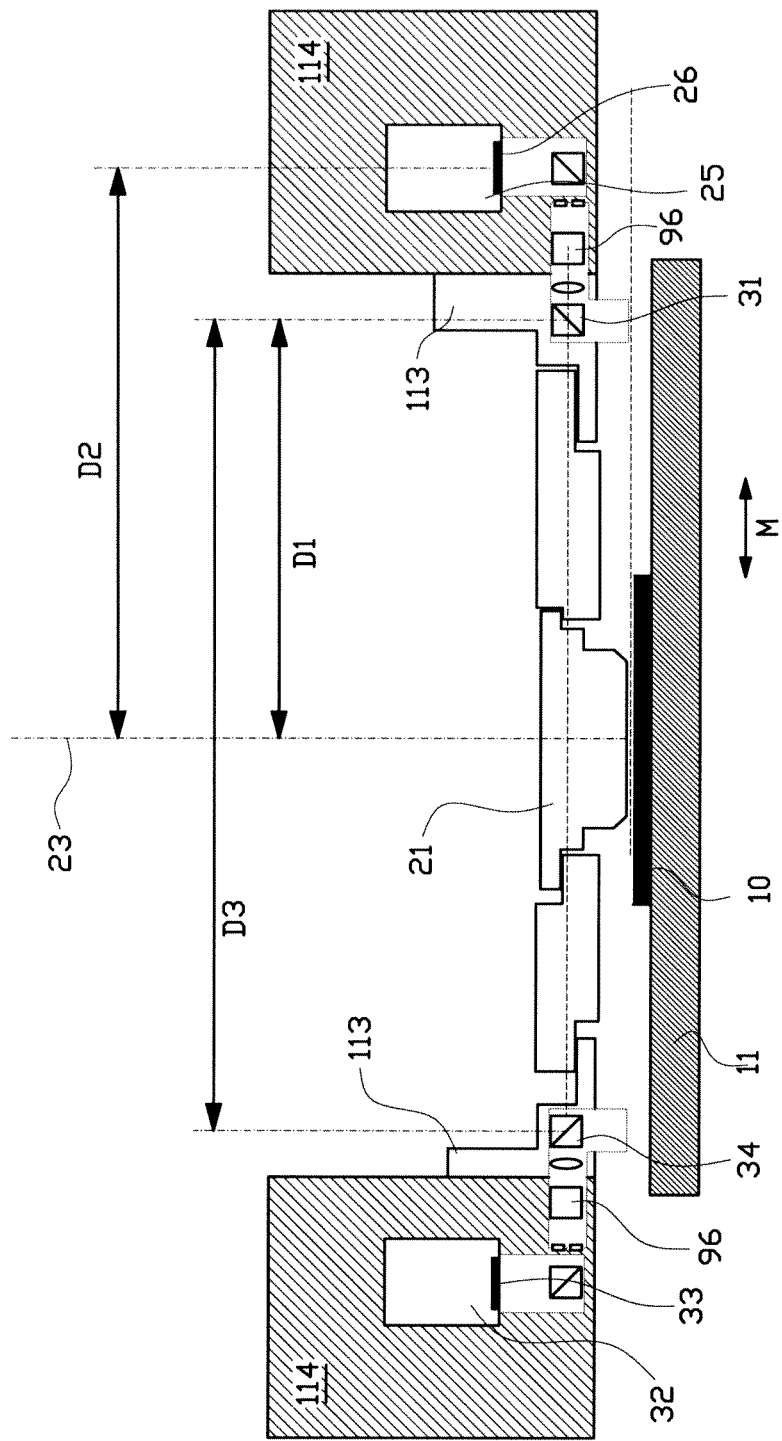
FIG. 3 shows a schematic cross-section of a part of a lithography system according to another embodiment of the invention.

In an embodiment, the optical element is arranged above the wafer surface, as can be seen in FIG. 2. FIG. 3 shows a schematic cross-section of a part of a lithography system according to another embodiment of the invention.

As can be seen in FIG. 3, the light detecting surface 26 of the light detector 25 may be arranged in parallel with target surface or perpendicular to the projection axis, while FIG. 2 shows that the light detecting surface 26 of the light detector 25 may be arranged perpendicular to target surface or parallel with the projection axis.

Also shown in the embodiment of FIG. 3, the optical element arranged for projecting the light beam on the target surface, i.e. mirror 31, is positioned adjacent to the final projection system 21 in a plane perpendicular to the projection axis. The mirror 31 may be arranged in the frame, either in the alignment inner subframe 113 (as is shown in FIG. 3) or in the alignment outer subframe 114.

The distance D1 and D2 may be defined as described above, where the distance D1 is defined with respect to a centre point of mirror 31. In an embodiment of the invention, distance D1 is smaller than distance D2, as is shown in FIG. 3. In an embodiment, distance D2 may be larger than 0.5×the diameter of the surface of wafer 10, as can be seen in FIG. 3. Furthermore, distance D2 may be larger than 0.5×a length of the chuck 11, as can also be seen in FIG. 3.

An actuator for moving the target surface may be provided (not shown in FIG. 3), in order to move the target surface under the optical element (the mirror 31 in FIG. 3), such that the optical element may project the light beam on the target surface, wherein the target surface may comprise the surface of the wafer 10 and the surface of the chuck 11, wherein each of these surface may comprise one or more position marks.

In an embodiment, the optical element is arranged above the chuck surface, as can be seen in FIG. 3.

In the embodiment of FIG. 2, the positioning of the optical axis 23 of the final projection system with respect to the target 10 may be performed using the distance D1 between said optical axis 23 and the centre of the optical element 24. In that case, it may be necessary to assure that the distance D1 is more or less stable with respect to temperature variations. Therefore, in an embodiment of the invention, the optical element 24 is provided in or on a support ring made of a material having a low thermal expansion coefficient in comparison with material of the final projection system and/or other parts of the system. In a further embodiment, flexures may be used to connect the support ring to the final projection system, as is further explained below with reference to FIGS. 6A and 6B.

However, in an embodiment according to FIG. 3, the positioning of the optical axis 23 of the final projection system with respect to the target 10 may be performed using position marks on the chuck and the position of the chuck. In that case, it may not be necessary to assure that the distance D1 is stable with respect to temperature variations. Therefore, the support ring may not be made of said material having low thermal expansion coefficient and may thus be easier to produce. In an embodiment of the invention, the lithography system may comprise another mark position detection system arranged for detecting a position of a position mark on the target surface, the other mark position detection system comprising a light source arranged for providing a light beam, an optical element (mirror 34) arranged for projecting said light beam substantially perpendicularly on the target surface and a light detector 32 arranged for detecting a reflected light beam, wherein the reflected light beam is generated by reflection of the light beam on the target surface.

All features described in this document regarding a mark position detection system, for example with reference to FIG. 2, may also be applicable to the other mark position detection system, for example with respect to distances between a centre point of the optical element (mirror 31) and the projection axis 23 and between a centre point of a light detecting surface 33 of the light detector 32.

The other mark position detection system may be positioned opposite to the mark position detection system with respect to the projection axis 23, as can be seen in FIG. 3. Thus, the mirror 31 (and/or the light detector 25) of the mark position detection system may be likewise positioned opposite to mirror 34 (and/or the light detector 32) of the other mark position detection system.

A distance between a centre point of the optical element (mirror 31) of the mark position detection system and a centre of the optical element (mirror 31) of the other mark position detection system is indicated by D3 in FIG. 3. In an embodiment, the distance D3 may be larger than the diameter of the surface of wafer 10, as can be seen in FIG. 3. Furthermore, distance D3 may be larger than a length of the chuck 11, as can also be seen in FIG. 3.

Figure 4:
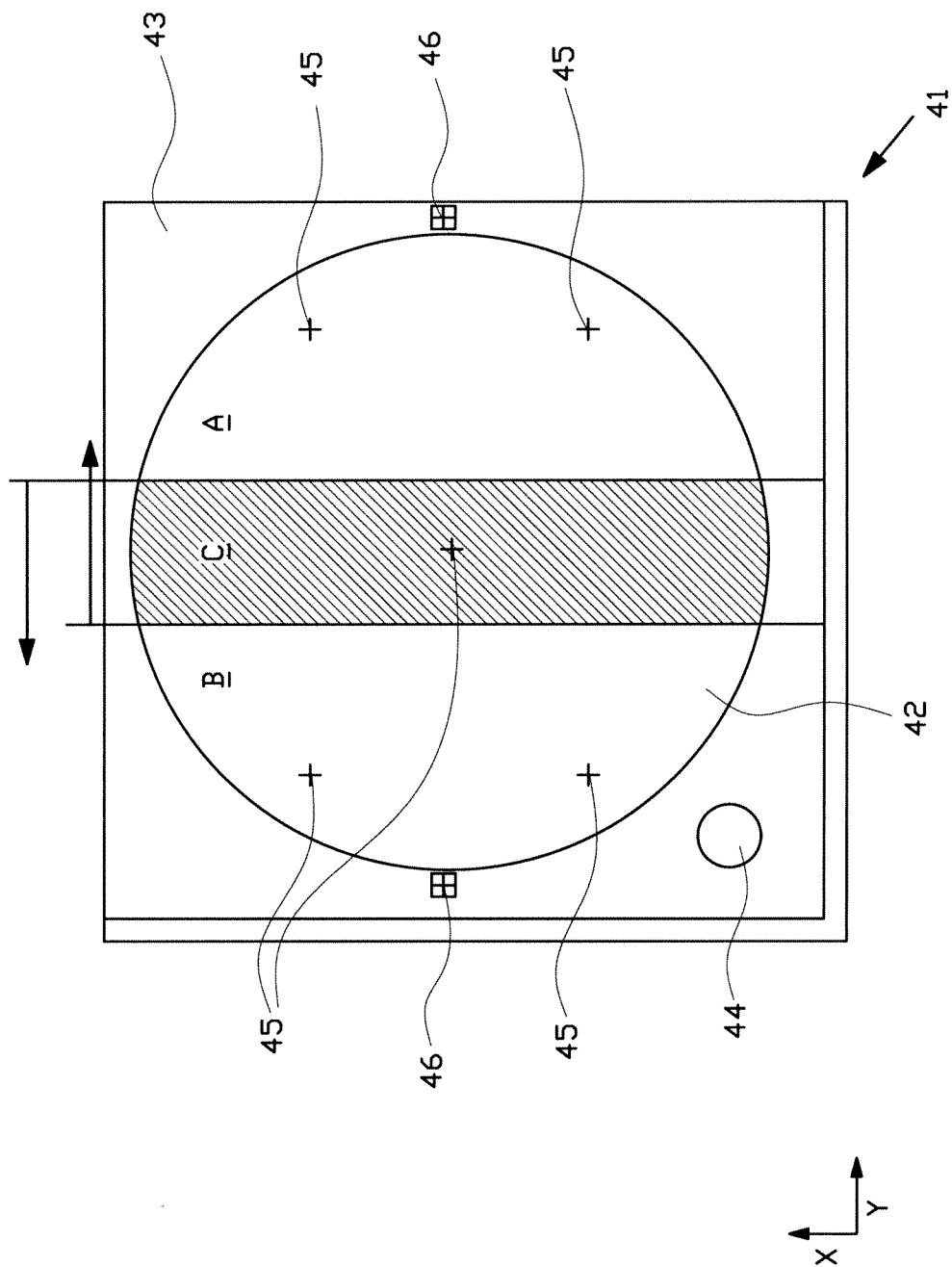
FIG. 4 schematically shows a top view of a target surface according to an embodiment of the invention.

It may the case that two position marks are positioned at opposite sides of a chuck surface (as is illustrated in FIG. 4), such that a distance between the position marks is larger than a diameter of the wafer surface. When the distance D3 between the mirror 31 of the mark position detection system and the mirror 34 of the other mark position detection system is larger than a diameter of the wafer surface, a movement of the target surface (i.e. the chuck surface) required between detecting the position of first position mark on the chuck surface and detecting the position of the second position mark on the chuck surface may advantageously be small.

FIG. 4 schematically shows a top view of a target surface according to an embodiment of the invention. In an embodiment, the target surface 41 may comprise a surface 42 of the wafer 10 and a surface 43 of the chuck 11. The chuck 11 may comprise a beam measurement sensor 44 for measuring beam properties of the patterning beam. The surface 42 of the wafer may comprise position marks 45 of the wafer 10. The surface 43 of the chuck may comprise position marks 46 of the chuck.

In an embodiment of the invention, the lithography system comprises an actuator arranged for moving the target surface in at least two dimensions (for example an x- and y-direction, as is indicated in FIG. 4). By moving the target surface, the optical element of the mark position detection system may project the light beam on different spots of the target surface. In this way, an area of the target surface may be scanned by the mark position detection system.

In an embodiment wherein the lithography system is provided with two mark position detection system (for example the lithography system explained above with reference to FIG. 3), the actuator may be arranged for moving the target surface in a predefined range, such that the optical element of the (first) mark position detection system may be able to scan an area A of the target surface, as is indicated in FIG. 4. The optical element of the other (second) mark position detection system may be able to scan an area B of the target surface, as is also indicated in FIG. 4. The two areas A and B may overlap and an overlap area C is also indicated in FIG. 4. Each area A, B and C may comprises a part of the surface 42 of the wafer and/or a part of the surface 43 of the chuck.

It may follow from the above that the position of position marks in area A may be detected by the (first) mark position detection system, the position of position marks in area B may be detected by the other (second) mark position detection system, while the position of position marks in area C may be detected by both the mark position detection systems.

In this way, the position marks in area C may be detected with a higher accuracy. Furthermore, the working of one mark position detection system may be compared to the working of the other mark position detection system, with respect to these position marks.

In an embodiment of the invention, the overlap area C of area A and area B is less than 10%, in a range of 5%-10%, less than 5%, or 0%.

FIG. 5 schematically shows examples of an image 51 of a reference mark, an image 53 of a position mark and a resulting image 55 according to an embodiment of the invention.

In an embodiment of the invention, the target surface is provided with one or more position marks, which each may comprise a structure. Each structure may comprise an array of substructures. Each of the substructures may have a reflection coefficient different than the reflection coefficient of the areas between the substructures. When a light beam is reflected on a position mark with a structure and the reflected light beam is detected by a camera, a corresponding image may be obtained.

In FIG. 5 an image 53 of a position mark with a structure 54 is indicated. The structure 54 may comprise an array of squares, as is depicted in FIG. 5. However, the structure may comprise different arrangements of differently shaped substructures, such as disk-shaped or circular shaped substructures, lines, etc.

In an embodiment of the invention, the mark position detection system comprises a reference plate 27, the reference plate 27 comprising a reference mark 51 and being at least partly transparent for the reflected light beam. The reference plate may be positioned in a light path of the reflected light beam, preferably between the optical element (the focus lens 24) and the target surface 22, as is shown in FIG. 2.

In the same way as a position mark, the reference mark may also comprise an array of substructures. Each of the substructures may have a transmission coefficient different than the transmission coefficient of the areas between the substructures. When a light beam is reflected on a target surface and passes through the reference mark and the reflected light beam is subsequently detected by a camera, a corresponding image 51 may be obtained.

In FIG. 5 an image 51 of a reference mark with a structure 52 is indicated. The structure 54 may comprise an array of squares, as is depicted in FIG. 5. However, the structure may comprise different arrangements of differently shaped substructures, such as disk-shaped or circular shaped substructures, lines, etc. It may be advantageous that the arrangement the substructures of the reference mark is complementary to the arrangement of the substructures of the position mark, as shown in FIG. 5.

It may be the case that the light beam is reflected on a position mark, the reflected light beam passes through the reference mark and the reflected light beam is subsequently detected by a camera. In this case a combined or resulting image 55 may be obtained. The resulting image 55 shows both the arrays of the substructures of the reference mark and the position mark.

From the position and orientation of the array of substructures of the position mark with respect to the array of substructures of the reference mark, the position and orientation of the position mark (and thus the target surface) may be determined. This determination may be more accurate in comparison with a mark position detection system without a reference plate and/or in comparison with a reference mark with only one substructure.

Both the image of the structure of the position mark and the image of the structure of the reference plate that are detected at the light detector, may be influenced by aberrations or other errors occurring in the light path of the reflected light beam. Since the position and orientation of the position mark may be determined with respect to the reference plate, these aberrations (or other errors) may cancel each other out, at least partly.

Figure 6A:
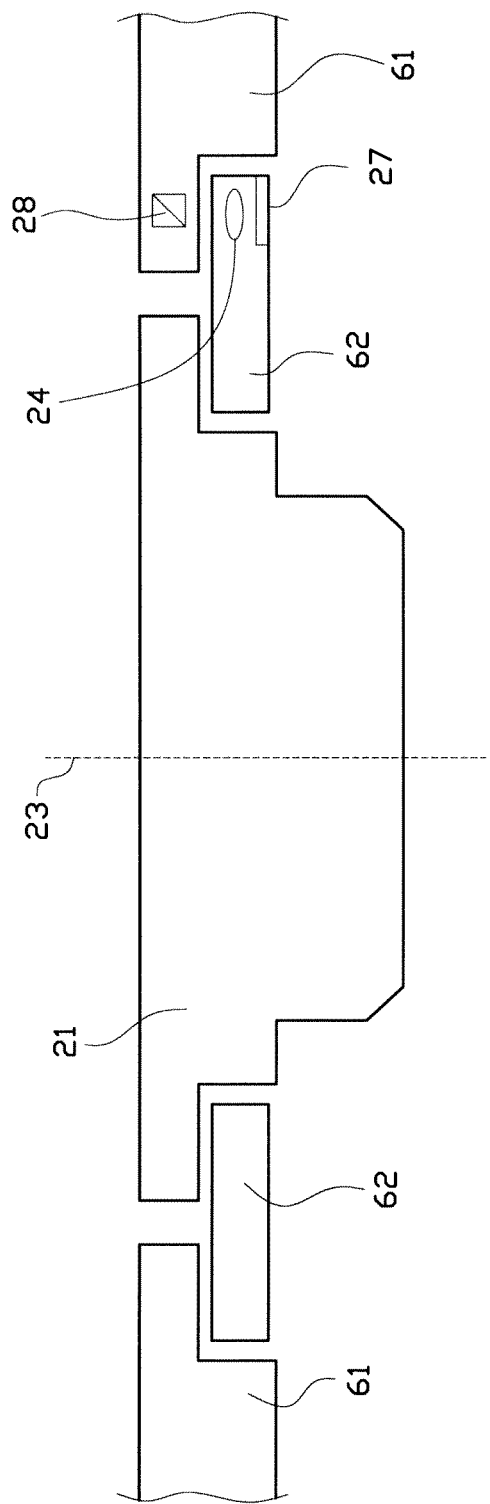
FIG. 6A shows a schematic overview of a part of a lithography system according to an embodiment of the invention.

FIG. 6A shows a schematic overview of a part of a lithography system according to an embodiment of the invention. In an embodiment of the invention, the final projection system support 26 comprises a support ring 62 and a holder 61. The support ring 62 may be arranged for supporting the final projection system 21 and may be arranged between the holder 61 and the final projection system 21, as is shown in FIG. 6A. The frame, or more particular the alignment inner subframe 113 may the arranged for supporting the holder. The holder 61 may be arranged for holding the support ring 62. The final projection system 21 and the holder 61 may thus not be connected directly, but may be connected via support ring 62. There may be no direct contact between the final projection system 21 and the holder 61.

In an embodiment, the support ring comprises a material with a low thermal expansion coefficient in comparison with material of the final projection system and/or the holder. Examples of a material with a low thermal expansion coefficient are glass ceramics, for example Zerodur. Also non-ceramics may be used, such as phosphor bronze.

The support ring 62 may be connected to the final projection system support by flexures, for example by springs or any other resilient connectors. The flexures may be are arranged substantially (or at least predominately) vertically, which may imply substantially parallel to the projection axis of the final projection system. The support ring 62 may be suspended from the holder 61, using for example flexures. At least three flexures may be used to define the position of the support ring in space. The flexures may be glued in recesses in the support ring 62, the holder 61 and/or final projection system 21.

When the final projection system would expand in a radial direction (i.e. perpendicular to the projection axis of the final projection system) due for example to temperature variations, the projection axis will remain at its position with respect to the target surface. The expansion of the final projection system in radial direction may cause the support ring to expand also in the radial direction. Because of the flexures, this would not cause an expansion force in the radial direction on the holder 61. Likewise, any expansions of holder 61 in a radial direction would not cause an expansion force on the support ring 62 because of the flexures. Therefore, the holder 61 may comprise a high thermal expansion material, such as aluminum.

In an embodiment of the invention, the reference plate 27 is arranged on the support ring 62. It may be the case that the optical element (focus lens 24 in FIG. 6A) is arranged in or on the support ring. The support ring may comprise an optical channel through which the light beam and the reflected light beam may pass. In this optical channel, further optical elements of the optical system may be arranged, such as lenses and/or a mirror. In another embodiment, the optical element may be arranged in the holder 61. The holder 61 may also comprise an optical channel.

Figure 6B:
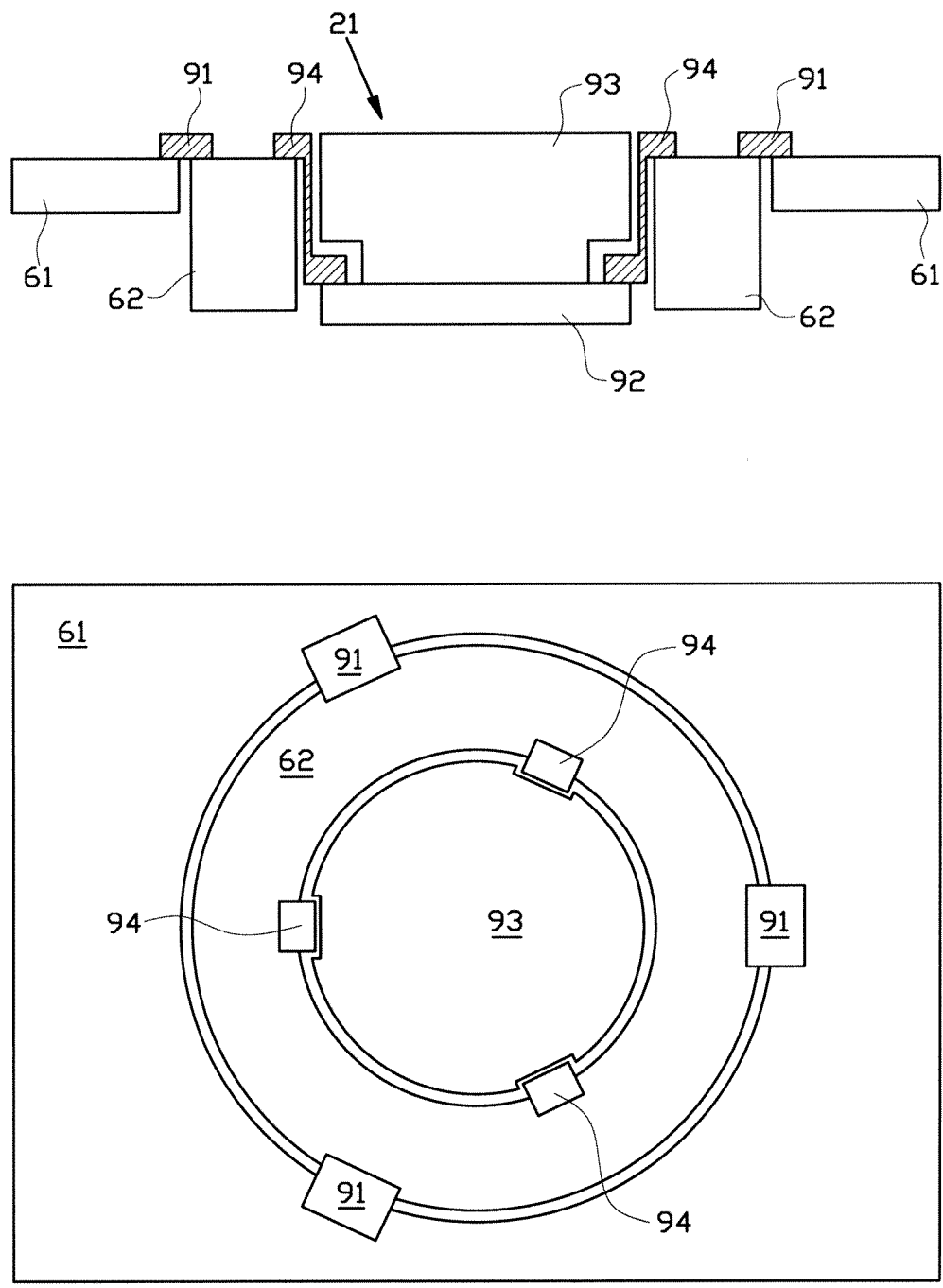
FIG. 6B shows a schematic overview of a part of a lithography system according to another embodiment of the invention.

FIG. 6B shows a schematic overview of a part of a lithography system according to another embodiment of the invention. FIG. 6B shows a cross section of the embodiment in the top part of FIG. 6B and a top view of the same embodiment in the bottom part of FIG. 6B.

The holder 61 may be referred to as a module plate: a plate which can be inserted into and removed from the frame (in particular the inner subframe 113) in order to facilitate the changing of (defect) modules.

The support ring 62 is connected to the holder 61 by three flexures 91. The support ring 62 may consist of material with a low thermal expansion coefficient in comparison with material of the final projection system and/or the holder.

The support ring 62 is connected to the final projection system 21 by three flexure 94. In an embodiment, the final projection system comprises at least one of a projection lens element 92 for projecting said patterning beam on at least a part of the target surface and a scan deflection element 93 for scanning said patterning beam over at least a part of the target surface. In that case the support ring 62 may be connected to the projection lens element 92 by the three flexures 94, as is shown in FIG. 6B.

Because of the three flexures 94, the optical axis of the final projection system, or more in particular the optical axis of the projection lens element 92, may remain more or less at its position with respect to the target and/or to the optical element of the mark position detection system, regardless of variations in the temperature. The flexures 91 also contribute to this effect.

Although not shown in FIG. 6B, the optical element may be provided in or on the support ring 62.

In general, when the optical element is provided on the final projection system support, or in particular on the support ring, it may be the case that the light beam (and/or the reflected light beam) travels partly through the vacuum of vacuum chamber between the optical element and the light detector (or the light source). In that case, the optical system may be arranged for directing at least one of the light beam and the reflected light beam through the vacuum.

Figure 6C:
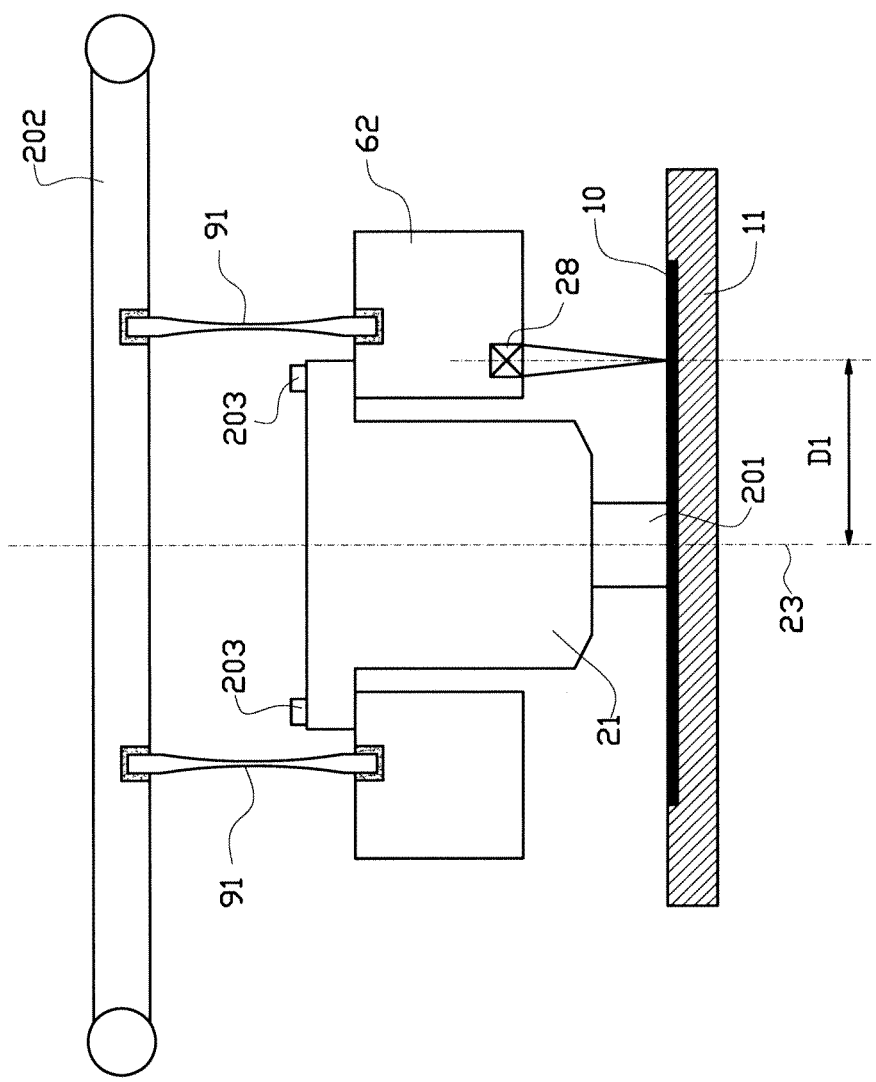
FIG. 6C shows a schematic overview of a part of a lithography system according to yet another embodiment of the invention.

FIG. 6C shows a schematic overview of a part of a lithography system according to yet another embodiment of the invention. In this embodiment, the support ring 62 is suspended from element 202. This may be the holder or the module plate according to the above, but it may also be the frame, when no holder is provided.

In the example of FIG. 6C, the final projection system 21 is connected to the support ring 62 by connecting means 203, for example by bolts. Also shown in FIG. 6C is patterning beam 201 directed from the final projection system 21 to the target or wafer 10.

Figure 7:
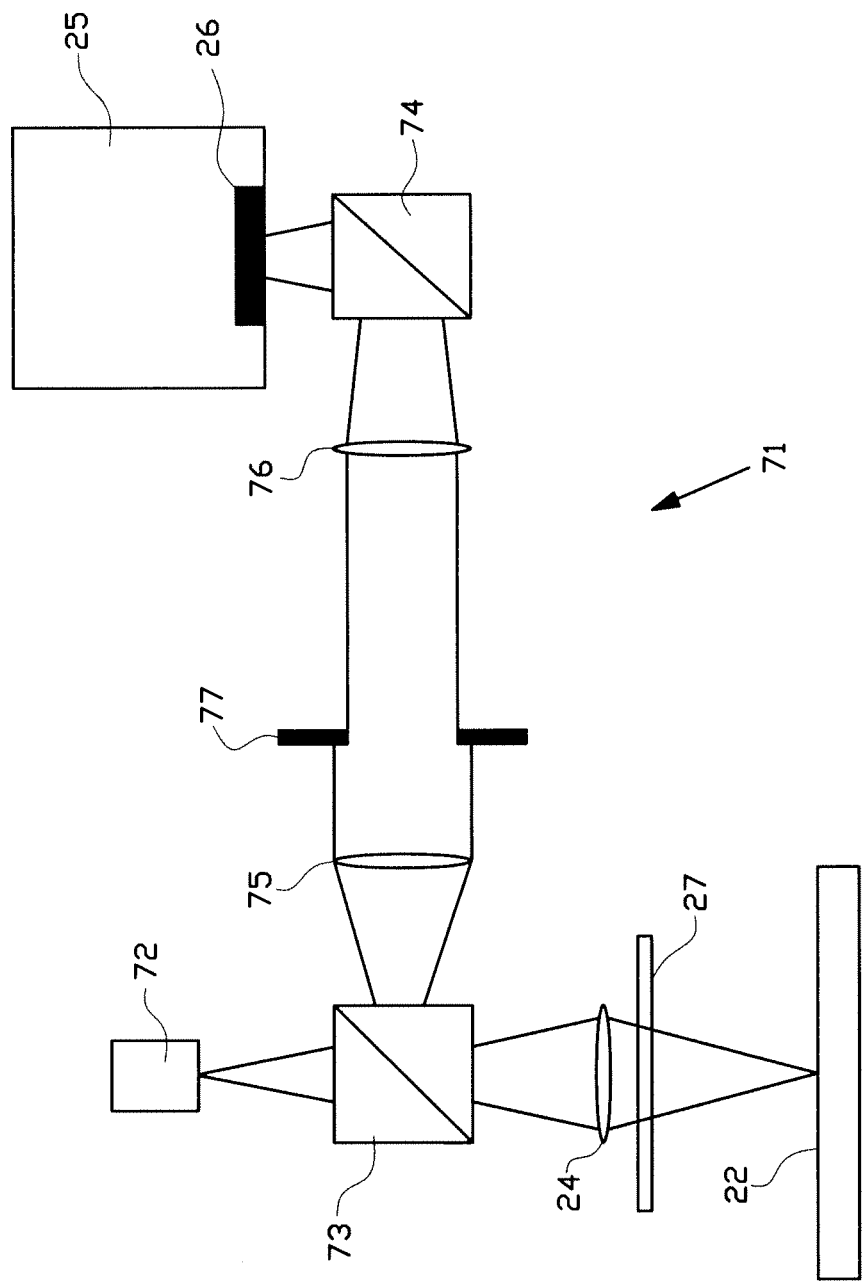
FIG. 7 schematically depicts an optical system according to an embodiment of the invention; and, FIG. 8 schematically shows three cross sections of an embodiment of the optical system according to an embodiment of the invention.

In an embodiment of the invention, the mark position detection system comprises an optical system arranged for guiding the light beam towards the target surface and for guiding the reflected light beam toward the light detector, the optical system comprising the optical element. FIG. 7 schematically depicts an optical system 71 according to an embodiment of the invention, wherein the optical element is the focus lens 24. However, focus lens 24 may be omitted from the embodiment of the FIG. 7 and in that case mirror 73 is the optical element that is arranged for projecting the light beam on the target surface.

The optical system may comprise the focus lens 24 and other optical elements, such as mirrors 73, 74. In FIG. 7 also the reference plate 27, the target surface 22 and a light source 72 are depicted. In an embodiment of the invention, the optical system further comprises an optical fiber (not shown in the FIG. 7) arranged for guiding the light beam, for example from the light source 72 towards another element of the optical system, for instance towards the mirror 73.

In an embodiment of the invention, the optical system 71 comprises a first lens 75 arranged for collimating the reflected light beam and a second lens 76 arranged for focusing a collimated reflected light beam, wherein the collimated reflected light beam is generated by the first lens 75. It may be case that the first lens 75 is arranged inside the final projection system support, for example inside the holder 61 or inside the support ring 62. It may the case that the second lens is arranged inside the holder 61 or inside the frame, for example inside the alignment inner subframe 113 or inside the alignment outer subframe 114.

This may provide an at least in part telescopic optical system. In that case, the distance between the support ring 62, the holder 61 or the frame may vary (for example), while the image of the position mark obtained at the light detecting surface 26 may remain in focus.

A channel may be provided inside the support ring, the holder, the alignment inner subframe 113 or the alignment outer subframe 114 through which the reflected light beam may pass (or travel). Between the support ring, the holder the alignment inner subframe 113 or the alignment outer subframe 114, the reflected light beam may pass (or travel) through the vacuum inside the vacuum chamber.

In an embodiment of the invention, the optical system comprises one or more telecentric lenses in the optical path of the reflected light beam. It may be the case that first lens 75 is a telecentric lens and/or that the second lens 76 is a telecentric lens. In that case, the magnification and/or orientation of the image of the position mark obtained at the light detecting surface 26 may constant, while the distance between the object plane and the telecentric lens (or the distance between the image plane and the telecentric lens) may vary.

In an embodiment of the invention, the optical system comprises an aperture 77 positioned in an optical path of the reflected light beam after the telecentric lens. In FIG. 7, aperture 77 is position after the first lens 75, which may be a telecentric lens.

Figure 8:
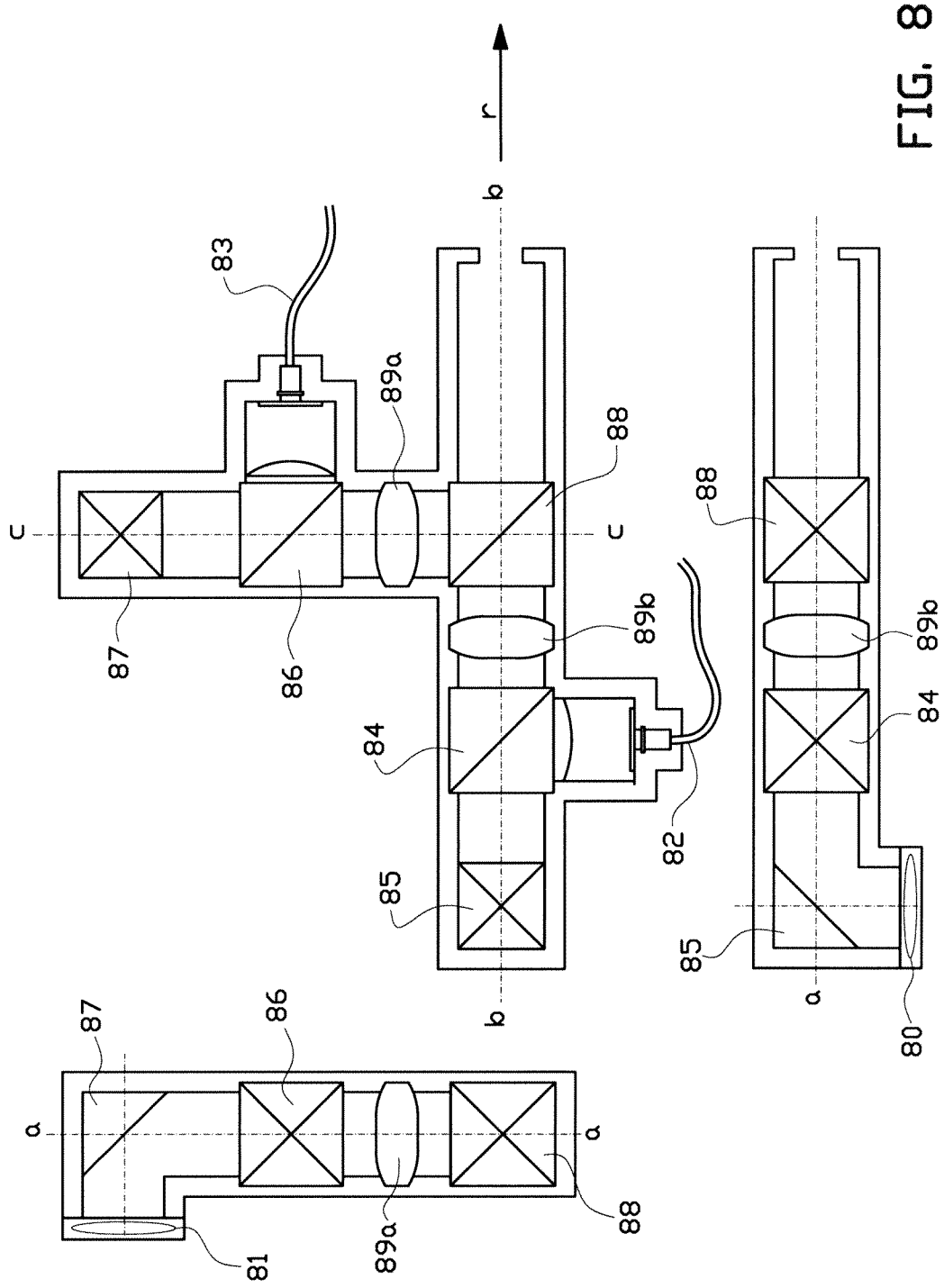

FIG. 8 schematically shows three cross sections of an embodiment of the optical system according to an embodiment of the invention. In the right upper corner a first cross section, parallel with the target surface is shown, while a second cross section in the right lower corner and a third cross section in the left corner are cross sections perpendicular to the first cross section.

The first cross section is taken along the lines a-a, the second cross section along the lines b-b and the third cross section along the lines c-c in FIG. 8.

In an embodiment of the invention, the mark position detection system comprises a focus lens 80 arranged for focusing a light beam on the target surface and another focus lens 81 arranged for focusing another light beam on the target surface. The light source may be arranged for providing the light beam and the other light beam. It may be case that a first optical fiber 82 and a second optical fiber 83 are provided to guide the light beam and the other light beam respectively from the light source.

The light beam may be guided by mirror 84 and mirror 85 toward the focus lens 80, while the other light beam may be guided by mirror 86 and mirror 87 towards the focus lens 81.

The light beam may be emitted from the focus lens 24 towards the target surface, where the light beam may be reflected by the target surface. The reflected light beam may enter the optical system via focus lens 80. The reflected light beam may be guided by mirror 85 towards the light detector. The light detector is not depicted in FIG. 8, but a direction towards the light detector is indicated by an arrow r. The mirror 84 and the mirror 88 may be arranged to let the reflected light beam pass, at least partially.

The other light beam may be emitted from the focus lens 81 towards the target surface, where the other light beam may be reflected by the target surface. The other reflected light beam may enter the optical system via focus lens 81. The other reflected light beam may be guided by mirror 87 and mirror 88 towards the light detector. The mirror 86 may be arranged to let the reflected light beam pass, at least partially.

In a light path of the reflected light beam or the other reflected light beam a lens 89a, 89b may be arranged. This may be a telecentric lens or a first lens 75 of a set lenses of two lenses, as described above. The second lens 76 (not depicted in FIG. 8) may be arranged close to the light detector.

In the embodiment of FIG. 8, the optical elements arranged to project the light beam on the target surface are focus lenses 80 and 81. However, in another embodiment these focus lenses 80 and 81 may be omitted. In that case, mirrors 85 and 87 are the optical elements arranged to project the light beam on the target surface.

In another embodiment of FIG. 8, the optical system may further comprise two references plates, which each may be positioned in a light path of a reflected light beam before the optical element, i.e. before focus lenses 80 and 81 or before mirror 85 and 87.

It may be understood that the described embodiment of a lithography system using an electron beam to pattern a target may also be applied to a lithography system using a light beam to pattern a target, mutatis mutandis.

According to another aspect of the invention, a mark position detection system is provided in accordance with one of the embodiments described in this document. Embodiments of the invention may also be described by one or more of the following clauses:

1] Lithography system for processing at least a part of a target, the target comprising a target surface with a position mark, the lithography system comprising
 a beam source arranged for providing a patterning beam;
 a final projection system having a projection axis and arranged for projecting said patterning beam on at least a part of the target surface, wherein the projection axis is arranged substantially perpendicular to said part of the target surface;
 a mark position detection system arranged for detecting a position of the position mark on the target surface, the mark position detection system comprising a light source arranged for providing a light beam, an optical element arranged for projecting said light beam substantially perpendicularly on the target surface and a light detector arranged for detecting a reflected light beam, wherein the reflected light beam is generated by reflection of the light beam on the target surface;
 wherein the mark position detection system comprises an optical system arranged for guiding the light beam towards the target surface and for guiding the reflected light beam toward the light detector, the optical system comprising said optical element.

2] Lithography system according to clause 1, wherein said optical element is positioned next to or adjacent to the final projection system.

3] Lithography system according to clause 1 or clause 2, wherein the light detector is positioned at a distance from the projection axis and said optical element is positioned between the final projection system and the light detector.

4] Lithography system according to any of clauses 1-3, further comprising a support system, comprising a final projection system support arranged for supporting the final projection system.

5] Lithography system according to clause 4, wherein said optical element is positioned next to or adjacent to the final projection system support.

6] Lithography system according to clause 4, wherein said optical element is positioned inside the final projection system support.

7] Lithography system according to any of clauses 4-6, wherein the support system further comprises a frame arranged for supporting the final projection system support, and wherein the light detector is positioned inside the frame.

8] Lithography system according to any of clauses 1-7, wherein:
said optical element comprises a centre point and a distance D1 is defined between the projection axis of the final projection system and said centre point;
said optical element is positioned in a plane perpendicular to the projection axis;
a cross section of the final projection system in said plane has a diameter D-fps; and,
the distance D1 is smaller than said diameter D-fps, or preferably smaller than 0.7×D-fps.

9] Lithography system according to any of clauses 1-8, wherein:
said optical element comprises a centre point and a distance D1 is defined between the projection axis of the final projection system and said centre point;
the light detector comprises a light detecting surface, the light detecting surface having a centre point;
a distance D2 is defined between the centre point of the light detecting surface and the projection axis of the final projection system; and,
D1 is smaller than D2, preferably smaller than 0.3×D2.

10] Lithography system according to any of clauses 1-9, wherein:
said optical element comprises a centre point and a distance D1 is defined between the projection axis of the final projection system and said centre point; and,
said distance D1 is smaller than 60 mm, preferably smaller than 50 mm, or about 45 mm.

11] Lithography system according to any of clauses 1-10, wherein the light detector comprises a camera, preferably a CCD camera.

12] Lithography system according to any of clauses 1-11, wherein:
the mark position detection system comprises a reference plate, the reference plate comprising a reference mark and being at least partly transparent for the reflected light beam; and,
the reference plate is positioned in a light path of the reflected light beam, preferably between said optical element and the target surface.

13] Lithography system according to any of clauses 1-12, wherein:
the final projection system support comprises a support ring and a holder;
the support ring is arranged for supporting the final projection system and is arranged between the holder and the final projection system;
the frame is arranged for supporting the holder and the holder is arranged for holding the support ring;
the support ring comprises a material with a low thermal expansion coefficient in comparison with material of the final projection system and/or the holder.

14] Lithography system according to clause 13, wherein the support ring is connected to the final projection system by flexures.

15] Lithography system according to any of clauses 12-14, wherein the reference plate is arranged on the support ring.

16] Lithography system according to any of clauses 1-15, wherein the optical system comprises a first lens arranged for collimating the reflected light beam and a second lens arranged for focussing a collimated reflected light beam, wherein the collimated reflected light beam is generated by the first lens.

17] Lithography system according to clause 16, wherein the first lens is arranged inside the final projection system support and the second lens is arranged inside the frame.

18] Lithography system according to any of clauses 1-17, wherein the optical system comprises at least one telecentric lens in the optical path of the reflected light beam.

19] Lithography system according to clauses 18, wherein the optical system comprises an aperture positioned in the optical path of the reflected light beam after the at least one telecentric lens.

20] Lithography system according to any of clauses 1-19, wherein the optical system further comprises an optical fiber arranged for guiding the light beam.

21] Lithography system according to any of clauses 1-20, wherein:
the mark position detection system is further arranged for detecting another position of another position mark on the target surface;
the light source is further arranged for providing another light beam;
the mark position detection system further comprises another optical element arranged for projecting the other light beam substantially perpendicularly on the target surface; and,
the light detector is arranged for detecting another reflected light beam, wherein the other reflected light beam is generated by reflection of the other light beam on the target surface.

22] Lithography system according to clause 21, wherein the optical system further comprises another optical fiber arranged for guiding the other light beam.

23] Lithography system according to any of clauses 1-22, further comprising:
an actuator arranged for moving the target surface in at least two dimensions;
another mark position detection system arranged for detecting a position of a position mark on the target surface, the other mark position detection system comprising a light source arranged for providing a light beam, an optical element arranged for projecting said light beam substantially perpendicularly on the target surface and a light detector arranged for detecting a reflected light beam, wherein the reflected light beam is generated by reflection of the light beam on the target surface; wherein the optical element of the mark position detection system is arranged for projecting the light beam of the mark position detection system on spots of an area A of the target surface during the movement of the target surface; wherein the optical element of the other mark position detection system is arranged for projecting the light beam of the other mark position detection system on spots of an area B of the target surface during the movement of the target surface; and, wherein an overlap of area A and area B is less than 10%, in a range of 5%-10%, less than 5%, or 0%.

24] Lithography system according to any of clauses 1-23, further comprising a wafer with a disk-shaped wafer surface, wherein:
the target surface comprises the wafer surface;
the optical element comprises a centre point and a distance D1 is defined between the projection axis of the final projection system and said centre point;
the distance D1 is smaller than 0.3×a diameter of the wafer surface.

25] Lithography system according to any of clauses 1-24, further comprising a wafer with a disk-shaped wafer surface, wherein:
the target surface comprises the wafer surface;
the optical element comprises a centre point and a distance D1 is defined between the projection axis of the final projection system and said centre point;
the distance D1 is larger than 0.5×a diameter of the wafer surface.

26] Lithography system according to any of clauses 1-25, further comprising:
a wafer with a disk-shaped wafer surface, wherein the target surface comprises the wafer surface;
another mark position detection system arranged for detecting a position of a position mark on the target surface, the other mark position detection system comprising a light source arranged for providing a light beam, an optical element arranged for projecting said light beam substantially perpendicularly on the target surface and a light detector arranged for detecting a reflected light beam, wherein the reflected light beam is generated by reflection of the light beam on the target surface; wherein a distance D3 between a centre point of the optical element of the mark position detection system and a centre point of the optical element of the other mark position detection system is larger than a diameter of the wafer surface.

27] Lithography system according to any of clauses 1-26, further comprising a wafer with wafer surface and a chuck with a chuck surface, wherein the chuck is arranged for supporting the wafer;
wherein the target surface comprises the wafer surface and the chuck surface;
wherein said optical element is arranged above the chuck surface or above the wafer surface.

28] Mark position detection system arranged for detecting a position of a position mark on a target surface, the mark position detection system comprising a light source arranged for providing a light beam, an optical element arranged for projecting said light beam substantially perpendicularly on the target surface and a light detector arranged for detecting a reflected light beam, wherein the reflected light beam is generated by reflection of the light beam on the target surface, wherein the mark position detection system comprises a reference plate, the reference plate comprising a reference mark and being at least partly transparent for the reflected light beam and positioned in a light path of the reflected light beam, preferably between said optical element and the target surface.

29] Mark position detection system according to clause 28, wherein the optical element is a focus lens or a mirror.

30] Mark position detection system according to any of clauses 28-29, wherein the light detector comprises a camera, preferably a CCD camera.

31] Mark position detection system according to any of clauses 28-30, further comprises an optical system arranged for guiding the light beam towards the target surface and for guiding the reflected light beam toward the light detector, the optical system comprising said optical element.

32] Mark position detection system according to clause 31, wherein the optical system further comprises a first lens arranged for collimating the reflected light beam and a second lens arranged for focussing a collimated reflected light beam, wherein the collimated reflected light beam is generated by the first lens.

33] Mark position detection system according to any of clauses 31-32, wherein the optical system comprises at least one telecentric lens in the optical path of the reflected light beam.

34] Mark position detection system according to any of clauses 31-33, wherein the optical system comprises a aperture positioned in the optical path of the reflected light beam after the at least one telecentric lens.

35] Mark position detection system according to any of clauses 31-34, wherein the optical system further comprises an optical fiber arranged for guiding the light beam.

36] Mark position detection system according to any of clauses 28-35, wherein the reference plate is arranged on said optical element.

37] Mark position detection system according to any of clauses 28-36, wherein the reference mark comprises an array of substructures, each substructure having a transmission coefficient different than a transmission coefficient of the areas between the substructures.

38] Mark position detection system according to clause 37, wherein the substructures have a square-shape.

39] Mark position detection system according to any of clauses 28-38, wherein the position mark comprises an array of substructures and the reference mark comprises an array of substructures, wherein an arrangement of the substructures of the reference mark is complementary to an arrangement of the substructures of the position mark.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:
1. Lithography system for processing at least a part of a target, the target comprising a target surface with a position mark, the lithography system comprising
a beam source arranged for providing a patterning beam;
a final projection system arranged for projecting said patterning beam on at least a part of the target surface;
a mark position detection system arranged for detecting a position of the position mark on the target surface, the mark position detection system comprising a light source arranged for providing a light beam, an optical element arranged for projecting said light beam on the target surface and a light detector arranged for detecting a reflected light beam, wherein the reflected light beam is generated by reflection of the light beam on the target surface, wherein the mark position detection system is configured for detecting a position of the target surface with respect to the optical element;
further comprising a support system, comprising a final projection system support arranged for supporting the final projection system, wherein the support system further comprises a frame arranged for supporting the final projection system support, wherein the light detector of said mark position detection system is positioned in the frame.

2. Lithography system according to claim 1, wherein the final projection system has a projection axis and wherein the light detector is positioned at a distance from the projection axis and said optical element is positioned between the final projection system and the light detector.

3. Lithography system according to claim 1, wherein the final projection system support comprises a support ring, arranged for supporting the final projection system.

4. Lithography system according to claim 3, wherein the final projection system support comprises a holder for holding the support ring and the support ring is arranged between the holder and the final projection system and wherein the frame is arranged for supporting the holder.

5. Lithography system according to claim 4 wherein the support ring is connected to the holder by flexures.

6. Lithography system according to claim 3, wherein said optical element is positioned in or on the support ring.

7. Lithography system according to claim 6, wherein the optical element is arranged for projecting said light beam substantially perpendicularly on the target surface.

8. Lithography system according to claim 3, wherein the support ring, comprises a material with a low thermal expansion coefficient in comparison with material of the final projection system and/or the holder.

9. Lithography system according to claim 3, wherein the final projection system is connected by flexures to the support ring.

10. Lithography system according to claim 1, wherein the final projection system support comprises a material with a low thermal expansion coefficient in comparison with material of the final projection system and/or the holder.

11. Lithography system according to claim 1, wherein the final projection system is connected by flexures to the final projection system support.

12. Lithography system according to claim 1, wherein the final projection system comprises:
a projection lens element for projecting said patterning beam on at least a part of the target surface; and,
a scan deflection element for scanning said patterning beam over at least a part of the target surface.

13. Lithography system according to claim 12, wherein the projection lens element is connected by flexures to the final projection system support.

14. Lithography system according to claim 12, wherein the final projection system support comprises a support ring, arranged for supporting the final projection system, and wherein the projection lens element is connected by flexures to the support ring.

15. Lithography system according to claim 1, wherein the optical element is arranged for projecting said light beam substantially perpendicularly on the target surface and/or wherein a final projection system has a projection axis and the projection axis is arranged substantially perpendicular to said part of the target surface.

16. Lithography system according to claim 1, wherein the light detector comprises a camera, preferably a CCD camera.

17. Lithography system according to claim 1, wherein the optical element is a focus lens or a mirror.

18. Lithography system according to claim 1, wherein the mark position detection system comprises an optical system arranged for guiding the light beam towards the target surface and for guiding the reflected light beam toward the light detector, the optical system comprising said optical element.

19. Lithography system according to claim 1, wherein said optical element is positioned next to or adjacent to the final projection system.

20. Lithography system according to claim 1, wherein said optical element is positioned in or on the final projection system support.

21. Lithography system according to claim 1, wherein the optical element is positioned in the frame.

22. Lithography system according to claim 1, wherein the frame is arranged for supporting one or more modules, wherein said one or more modules comprise at least one of:
an illumination optics module, preferably comprising the beam source;
an aperture array and condenser lens module;
a beam switching module; and,
a projection optics module, preferably comprising the final projection system.

23. Lithography system according to claim 1, wherein:
the mark position detection system comprises a reference plate, the reference plate comprising a reference mark and being at least partly transparent for the reflected light beam; and,
the reference plate is positioned in a light path of the reflected light beam.

24. Lithography system according to claim 23, wherein the reference plate is positioned between said optical element and the target surface.

25. Lithography system according to claim 23, wherein the reference plate is arranged on the final projection system support or on the support ring.

26. Lithography system according to claim 23, wherein the reference mark comprises an array of substructures, each substructure having a transmission coefficient different than a transmission coefficient of the areas between the substructures.

27. Lithography system according to claim 26, wherein the substructures have a square-shape.

28. Lithography system according to claim 23, wherein the position mark comprises an array of substructures and the reference mark comprises an array of substructures, wherein an arrangement of the substructures of the reference mark is complementary to an arrangement of the substructures of the position mark.

29. Lithography system according to claim 1, further comprising:
an actuator arranged for moving the target surface in at least two dimensions;
another mark position detection system arranged for detecting a position of a position mark on the target surface, the other mark position detection system comprising:
a light source arranged for providing a light beam,
an optical element arranged for projecting said light beam on the target surface, and
a light detector arranged for detecting a reflected light beam, wherein the reflected light beam is generated by reflection of the light beam on the target surface, wherein the light detector is positioned in the frame, and wherein the another mark detection system is arranged for detecting a position of a mark on the target surface with respect to said optical element.

30. Lithography system according to claim 29, wherein the optical element of the mark position detection system is arranged for projecting the light beam of the mark position detection system on spots of an area A of the target surface during the movement of the target surface; wherein the optical element of the other mark position detection system is arranged for projecting the light beam of the other mark position detection system on spots of an area B of the target surface during the movement of the target surface; and, wherein an overlap of area A and area B is less than 10%, in a range of 5%-10%, less than 5%, or 0%.

31. Lithography system according to claim 29, further comprising:
- a wafer with a disk-shaped wafer surface, wherein the target surface comprises the wafer surface;
- wherein a distance D3 between a centre point of the optical element of the mark position detection system and a centre point of the optical element of the other mark position detection system is larger than a diameter of the wafer surface.

* * * * *